US011431358B2

(12) United States Patent
Park et al.

(10) Patent No.: US 11,431,358 B2
(45) Date of Patent: Aug. 30, 2022

(54) DEVICE AND METHOD FOR UPCONVERTING SIGNAL IN WIRELESS COMMUNICATION SYSTEM

(71) Applicants: Samsung Electronics Co., Ltd., Suwon-si (KR); Dongguk University Industry-Academic Cooperation Foundation, Seoul (KR)

(72) Inventors: Jung-Dong Park, Seoul (KR); Woojae Lee, Suwon-si (KR); Juho Son, Suwon-si (KR); Hyohyun Nam, Seoul (KR)

(73) Assignees: Samsung Electronics Co., Ltd., Suwon-si (KR); Dongguk University Industry-Academic Cooperation Foundation, Seoul (KR)

( * ) Notice: Subject to any disclaimer, the term of this patent is extended or adjusted under 35 U.S.C. 154(b) by 76 days.

(21) Appl. No.: 16/999,552

(22) Filed: Aug. 21, 2020

(65) Prior Publication Data

US 2021/0058102 A1 Feb. 25, 2021

Related U.S. Application Data

(60) Provisional application No. 62/890,869, filed on Aug. 23, 2019.

(30) Foreign Application Priority Data

Jul. 20, 2020 (KR) .................. 10-2020-0089634

(51) Int. Cl.
*H04B 1/04* (2006.01)
*H03F 3/45* (2006.01)
*H04B 1/30* (2006.01)

(52) U.S. Cl.
CPC .......... *H04B 1/04* (2013.01); *H03F 3/45991* (2013.01); *H04B 1/30* (2013.01);
(Continued)

(58) Field of Classification Search
CPC ... H03B 1/00; H03B 5/12; H03B 7/06; H03B 19/12; H03F 1/32; H03F 3/21; H03F 3/45;
(Continued)

(56) References Cited

U.S. PATENT DOCUMENTS 9,071,197 B2 6/2015 Vora et al.
2011/0001540 A1* 1/2011 Bao ..................... H03D 7/1441
327/355
(Continued)

FOREIGN PATENT DOCUMENTS

KR 10-0636830 B1 10/2006
KR 10-2011-0025757 A 3/2011
(Continued)

OTHER PUBLICATIONS

International Search Report and written opinion dated Nov. 30, 2020, issued in International Application No. PCT/KR2020/011200.
(Continued)

*Primary Examiner* — Shawkat M Ali
(74) *Attorney, Agent, or Firm* — Jefferson IP Law, LLP

(57) ABSTRACT

The disclosure relates to a pre-5th-generation (5G) or 5G communication system to be provided for supporting higher data rates beyond 4th-generation (4G) communication system such as long term evolution (LTE). An operation method of a device for upconversion in a wireless communication system is provided. The method includes receiving a first local oscillator (LO) signal, generating a second LO signal, based on the first LO signal and cross-coupled latches, receiving an input signal, generating an upconverted fre-
(Continued)

quency, based on the second LO signal and the input signal, generating an output signal obtained by processing a harmonic component included in the upconverted frequency, and transmitting the generated output signal.

20 Claims, 21 Drawing Sheets

(52) U.S. Cl.
CPC ............... *H04B 2001/0408* (2013.01); *H04B 2001/0491* (2013.01); *H04B 2001/307* (2013.01)

(58) Field of Classification Search
CPC ......... H03F 3/45991; H04B 1/04; H04B 1/30; H04B 15/04; H04B 2001/307; H04B 2001/0408; H04B 2001/0491
USPC .... 327/51, 118, 199, 355, 539; 331/57, 116, 331/117, 176; 375/219, 260, 262, 267, 375/295, 316
See application file for complete search history.

(56) References Cited

U.S. PATENT DOCUMENTS

| | | | |
|---|---|---|---|
| 2011/0050296 A1* | 3/2011 | Fagg | .................... H03B 5/1212 327/118 |
| 2014/0162580 A1* | 6/2014 | Leung | ..................... H04B 1/30 455/226.1 |
| 2015/0188741 A1 | 7/2015 | Chen et al. | |
| 2017/0179881 A1* | 6/2017 | Caffee | ...................... H03B 5/08 |
| 2018/0254755 A1 | 9/2018 | Leipold et al. | |

FOREIGN PATENT DOCUMENTS

| | | |
|---|---|---|
| KR | 10-2011-0051215 A | 5/2011 |
| KR | 10-1398175 B1 | 5/2014 |
| KR | 10-2016-0060700 A | 5/2016 |
| KR | 10-2019-0089955 A | 7/2019 |

OTHER PUBLICATIONS

Hyohyun Nam et al., A Compact I/Q Up-Conversion Chain for a 5G Wireless Transmitter in 65-nm CMOS Technology, IEEE Microwave and Wireless Components Letters, vol. 30, No. 3, Mar. 2020.
Jinbo Li et al., A 10 GHz Up-conversion Mixer with 13.6 dBm OIP3 Using Regulatorbased Linearized Gm Stage and Harmonic Nulling, 2018 IEEE/MTT-S International Microwave Symposium 2018.
You-Sun Won et al., A 24 GHz Highly Linear Up-Conversion Mixer in CMOS 0.13 μm Technology, IEEE Microwave and Wireless Components Letters, vol. 25, No. Jun. 6, 2015.
Joong-Geun Lee et al., 60 GHz Direct Up-Conversion Mixer with Wide IF Bandwidth and High Linearity in 65 nm CMOS, RFIT 2017.
Chul Woo Byeon et al., A High Linearity, Image LO-Rejection I/Q Up-Conversion Mixer for 5G Cellular Communications, Proceedings of the 10th European Microwave Integrated Circuits Conference, Sep. 7-8, 2015, Paris, France.

* cited by examiner

DEVICE AND METHOD FOR UPCONVERTING SIGNAL IN WIRELESS COMMUNICATION SYSTEM

CROSS-REFERENCE TO RELATED APPLICATION(S)

This application is based on and claims priority under 35 U.S.C. § 119(e) of a U.S. Provisional application Ser. No. 62/890,869, filed on Aug. 23, 2019, in the U.S. Patent and Trademark Office, and under 35 U.S.C. § 119(a) of a Korean patent application number 10-2020-0089634, filed on Jul. 20, 2020, in the Korean Intellectual Property Office, the disclosure of which is incorporated by reference herein in its entirety.

JOINT RESEARCH AGREEMENT

The disclosure was made by or on behalf of the below listed parties to a joint research agreement. The joint research agreement was in effect on or before the date the disclosure was made and the disclosure was made as a result of activities undertaken within the scope of the joint research agreement. The parties to the joint research agreement are 1) Samsung Electronics Co., Ltd. and 2) Dongguk University Industry-Academic Cooperation Foundation.

BACKGROUND

1. Field

The disclosure relates to a wireless communication system. More particularly, the disclosure relates to a device and a method for upconverting a signal in a wireless communication system.

2. Description of Related Art

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a 'beyond 4G Network' or a 'post long term evolution (LTE) system'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G communication systems.

In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like.

In the 5G system, Hybrid frequency shift keying (FSK) and quadrature amplitude modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The latest 5G wireless communication technology aims to accomplish high data rates and transfer of large amount of data through high quality communications. Studies have proceeded on minimizing an antenna for 5G wireless communications, and implementing of high data rates in wireless communications by using the advantages of a small antenna. Furthermore, a frequency upconverter using voltage feedback and complementary derivative superposition technologies has been developed to upconvert frequencies in performing 5G wireless communications.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a device and a method for reducing an error between a phase and a gain, which occurs in a frequency upconverter in a wireless communication system.

Another aspect of the disclosure is to provide a device and a method for improving linearity in frequency upconversion in a wireless communication system.

Another aspect of the disclosure is to provide a device and a method for compactly placing a circuit configured to implement frequency upconversion in a wireless communication system.

Additional aspects will be set forth in part in the description which follows and, in part, will be apparent from the description, or may be learned by practice of the presented embodiments.

In accordance with an aspect of the disclosure, an operation method of a device for upconversion in a wireless communication system is provided. The method includes receiving a first local oscillator (LO) signal, generating a second LO signal, based on the first LO signal and cross-coupled latches, receiving an input signal, generating an upconverted frequency, based on the second LO signal and the input signal, generating an output signal obtained by processing a harmonic component included in the upconverted frequency and transmitting the generated output signal.

In accordance with another aspect of the disclosure, a device for upconversion in a wireless communication system is provided. The device includes at least one transceiver, and at least one processor functionally coupled to the at least one transceiver, wherein the at least one processor performs control to receive a first local oscillator (LO) signal, generate a second LO signal, based on the first LO signal and cross-coupled latches, receive an input signal generate an upconverted frequency, based on the second LO signal and the input signal, generate an output signal obtained by processing a harmonic component included in the upconverted frequency, and transmit the generated output signal.

A device and a method according to various embodiments can minimize an error between a phase and a gain, which occurs in a frequency upconverter, to reduce an error vector magnitude (EVM).

A device and a method according to various embodiments can improve linearity through circuit arrangement in a frequency upconverter.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

Figure 1:
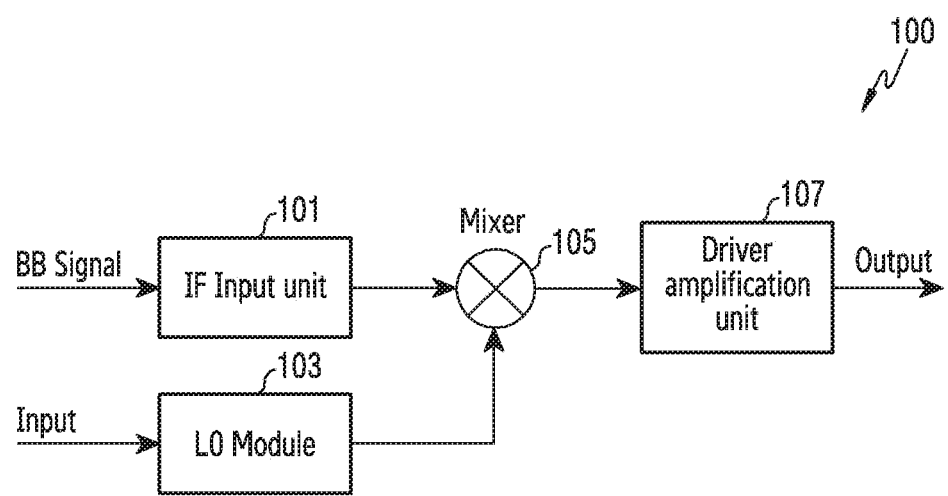
FIG. 1 illustrates a block diagram of a device for upconverting frequency in a wireless communication system according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Hereinafter, various embodiments of the disclosure will be described based on an approach of hardware. However, various embodiments of the disclosure include a technology that uses both hardware and software, and thus the various embodiments of the disclosure may not exclude the perspective of software.

Hereinafter, the disclosure relates to a device and a method for upconverting a signal in a wireless communication system. Specifically, the disclosure provides a technology for upconverting a signal by an improved method in a wireless communication system.

In the following description, a term indicating a signal, a term indicating a channel, a term indicating control information, terms indicating network entities, terms indicating elements of a device, and the like are exemplified for convenience of explanation. Accordingly, the disclosure is not limited to the following terms and other terms having the same technical meaning may be used.

In the following description, a metric for signal gain, signal quality, etc. may be at least one of, for example, reference signal received power (RSRP), reference signal received quality (RSRQ), received signal strength indicator (RSSI), signal to interference and noise ratio (SINR), carrier to interference and noise ratio (CINR), SNR, error vector magnitude (EVM), bit error rate (BER), block error rate (BLER). In addition to the described examples, other terms having the same technical meaning as the examples or other metrics indicating signal quality can be also used.

In addition, in the disclosure, although the expression "more than" or "less than" may be used in order to determine whether or not a particular condition is fulfilled or satisfied, this is only an example and does not exclude the expression "equal to or more than" or "equal to or less than" The expression "equal to or more than" can be replaced with "more than", the expression "equal to or less than" can be replaced with "less than", and the expression "equal to or more than and less than" can be replaced with "more than and equal to or less than" in the conditions above.

In addition, the disclosure includes terms used in some communication protocols (e.g. 3rd generation partnership project (3GPP)) to explain various embodiments, but the terms merely correspond to examples. Various embodiments may also be easily modified and then applied to other communication systems.

Hereinafter, the disclosure proposes a device and a method for reducing a phase mismatch and a gain mismatch occurring in a frequency upconverter to increase an image rejection ratio (IRR) occurring between the mismatches. If an IRR is increased, an error vector magnitude (EVM) of a transmitter is improved. In addition, the disclosure proposes a device and a method for connecting, to an amplifier of a frequency upconverter, a cross-coupled structure for removing a harmonic component, to accomplish high linearity.

FIG. 1 illustrates a block diagram of a device for upconverting frequency in a wireless communication system according to an embodiment of the disclosure. The term " . . . unit" or the ending of a word, such as " . . . or", " . . . er", or the like used hereinafter may indicate a unit of processing at least one function or operation, and this may be embodied by hardware, software, or a combination of hardware and software.

Referring to FIG. 1, a block diagram 100 of a device for frequency upconversion includes an intermediate frequency (IF) input unit 101, a local oscillator (LO) module 103, a mixer 105, and a driver amplification unit 107.

The IF input unit 101 performs a function for generating a frequency signal between a baseband (BB) and a radio frequency (RF) for wireless transmission/reception, i.e. a signal having an IF frequency. According to an embodiment, the IF input unit 101 may receive a BB signal and filter the received BB signal, to generate and output an IF signal to be input to the mixer 105.

The LO module 103 performs a function of an oscillator locally or limitedly used. According to an embodiment, the LO module 103 may include a configuration for performing at least one voltage-controlled oscillator (VCO) function for generating a desired frequency value. According to an embodiment, the LO module 103 may receive a signal input from the outside and generate and output an LO signal to be input to the mixer 105.

The mixer 105 performs a function for converting an input frequency. The mixer 105 may perform a frequency shift by using a component of an input frequency, to perform a frequency conversion function. According to an embodiment, the mixer 105 may perform a function for conversion to a frequency enabling wireless transmission, based on a signal input from the IF input unit 101, and a signal input from the LO module 103. According to an embodiment, the mixer 105 may transfer a signal generated through frequency conversion to the driver amplification unit 107.

The driver amplification unit 107 operates to amplify an input signal. According to an embodiment, a converted frequency requires a high gain and a high power so that the driver amplification unit 107 transfers a signal input from the mixer 105, up to a communication receiver. Therefore, a frequency upconverter may include a drive amplifier for a high gain of a converted RF frequency (high frequency) and a power amplifier for a high power thereof. According to an embodiment, the driver amplification unit 107 includes a drive amplifier (DA) configured to amplify a gain, an RF filter configured to allow selection of only a desired frequency, a power amplifier (PA) configured to amplify power to transfer an RF frequency up to a communication receiver, and an RF output node configured to output an amplified RF frequency. According to an embodiment, the driver amplification unit may amplify an RF signal received from the mixer 105 and output the amplified signal.

Figure 2:
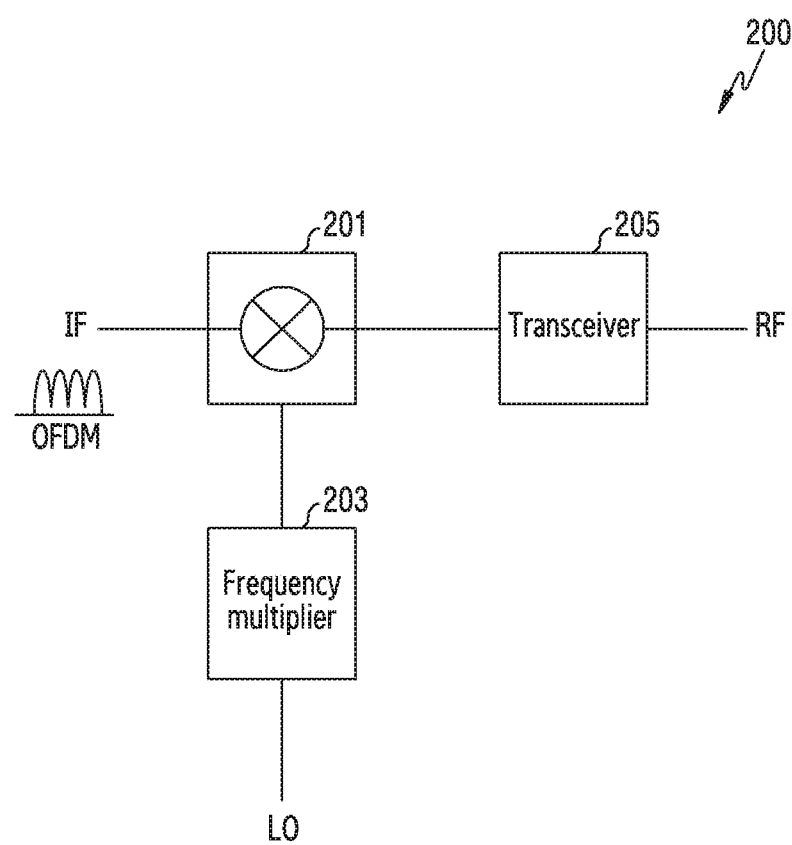
FIG. 2 illustrates a configuration of a communication unit in a wireless communication system according to an embodiment of the disclosure.

FIG. 2 illustrates a configuration of a communication unit in a wireless communication system according to an embodiment of the disclosure. FIG. 2 illustrates a configuration of an example of a configuration for transmitting a frequency generated in FIG. 1, according to an embodiment of the disclosure.

Referring to FIG. 2, a communication unit 200 includes a frequency converter 201, a frequency multiplier 203, and a transceiver 205.

The frequency converter 201 performs a function for upconverting frequency. According to an embodiment, the frequency converter 201 may receive an orthogonal frequency division multiplexing (OFDM) type IF signal, convert the frequency of the signal, and then transfer the signal with converted frequency to the transceiver 205.

The frequency multiplier 203 performs a function for outputting an integer multiple of an input frequency. According to an embodiment, the frequency multiplier 203 may amplify a frequency n times and output the amplified frequency. For example, if an LO frequency signal having about 5-5.75 GHz is received, the frequency multiplier may output a frequency signal having about 20-23 GHz.

The transceiver 205 performs functions for transmitting or receiving a signal through a wireless channel According to an embodiment, the transceiver 205 may generate a signal for wireless transmission, based on a signal received from a frequency upconverter. For example, the transceiver 205 may change a signal having about a 10-11.5 GHz band into a signal having about a 26.5-29.5 GHz band, and output the changed signal, in order to perform 5' generation (5G) communication.

Figure 3:
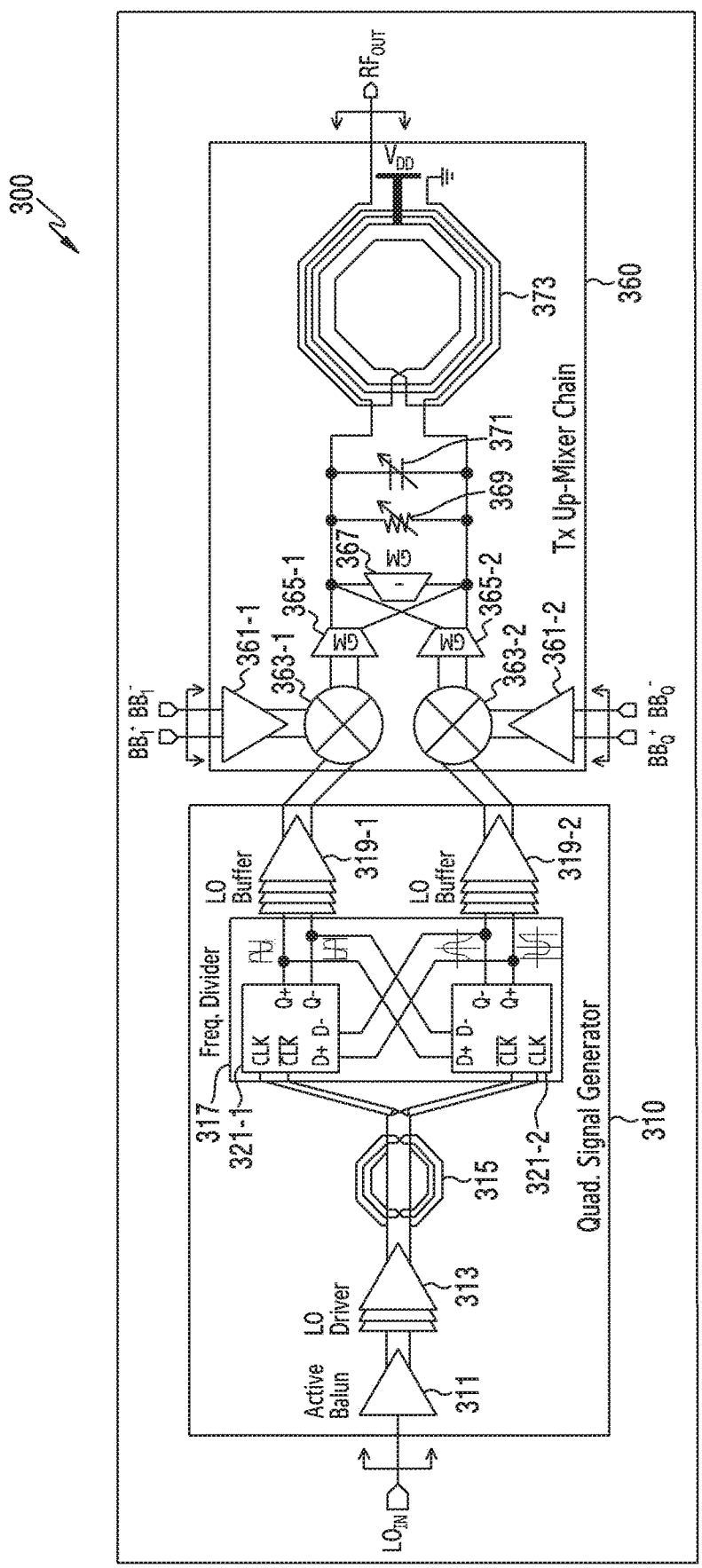
FIG. 3 illustrates a configuration of a device for upconverting frequency in a wireless communication system according to an embodiment of the disclosure.

FIG. 3 illustrates a configuration of a device for upconverting frequency in a wireless communication system according to an embodiment of the disclosure.

Referring to FIG. 3, a device 300 for upconverting frequency may include a quadrature signal generator (QSG) 310 and an upconversion chain (Tx up-mixer chain) 360.

The QSG 310 performs a function of generating an LO signal to be transferred to the Tx up-mixer chain 360. According to an embodiment, the QSG 310 may generate a rail-to-rail LO signal for operating an in-phase/quadrature mixer (I/Q mixer). The QSG 310 may include a balun 311, an LO driver 313, an inductor 315, a frequency divider 317, and LO buffers 319-1 and 319-2.

The balun 311 performs a function of signal conversion between a balanced circuit and an unbalanced circuit, and may use a phase difference between current and voltage with respect to a gate and a drain of a field effect transistor (FET), and include a structure in which a common source and a common gate are combined. A signal output from the balun is input to the frequency divider 317 through the LO driver 313 and the inductor 315. For example, the inductor 315 may include an inductance of about 0.65 nH. However, according to another embodiment, an inductance value may be changed according to a user configuration.

The frequency divider 317 may include at least two current-mode logic (CML) latches. According to an embodiment, the frequency divider 317 may include a first CML latch 321-1 and a second CML latch 321-2, and the CML latches may be connected to each other in a cross-coupling manner According to an embodiment, in the cross-coupling manner, D+ and D− nodes of the first CML latch 321-1 are connected to Q− and Q+ nodes of the second CML latch 321-2, and are connected to input nodes of the second LO buffer 319-2, respectively. Q+ and Q− nodes of the first CML latch 321-1 are connected to D+ and D− nodes of the second CML latch, and are connected to input nodes of the first LO buffer 319-1, respectively. A signal output from the frequency divider 317 is input to the LO buffers 319-1 and 319-2 for frequency signal amplification, based on the CML latches that are cross-coupled to each other.

According to an embodiment, the QSG 310 receives an LO input signal through the balun 311, and the balun 311 receives the LO input signal, and outputs and transfers balanced signals to the LO driver 313. An inductor (inductive) peaking technique may be applied to the transferred signals. The frequency divider 317 includes cross-coupled CML latches operating in an ultra-high frequency band, and generates an I/Q output signal, based on the CML latches. After the signal generation, in order for generation of a rail-to-rail LO signal, the QSG 310 generates a rail-to-rail type LO signal by using an LO buffer based on a limiter implemented by cascade-connecting of an inverter-based high gain amplifier. According to an embodiment, a gain mismatch and a phase mismatch between an in-phase mixer (I-mixer) and a quadrature mixture (Q− mixer) can be reduced based on CML latches that are cross-coupled to each other.

The Tx up-mixer chain 360 performs a function of frequency upconversion. The Tx up-mixer chain 360 includes IF amplifiers 361-1 and 361-2, frequency mixers 363-1 and 363-2, GM stages 365-1 and 365-2, a negative GM stage 367, a variable resistor 369, a variable capacitor 371, and a transformer 373.

According to an embodiment, the IF amplifiers 361-1 and 361-2 may receive a baseband signal through a baseband node, convert the baseband signal into an intermediate frequency signal, amplify the converted signal, and input the amplified signal to the frequency mixers 363-1 and 363-2. The IF amplifiers 361-1 and 361-2 may receive an intermediate frequency signal through an intermediate frequency node, amplify the signal, and input the amplified signal to the frequency mixers 363-1 and 363-2.

The frequency mixers 363-1 and 363-2 perform a function of mixing at least two frequency input signals to convert the signals into new frequency output signals. The function of converting a frequency includes at least one process among heterodyning, frequency shifting, and frequency mixing processes. According to an embodiment, the first frequency mixer 363-1 receives an output signal of the first LO buffer 319-1 of the QSG and an output signal of the first IF amplifier 361-1, and mixes the frequencies thereof. The second frequency mixer 363-2 receives an output signal of the second LO buffer 319-2 of the QSG and an output signal of the second IF amplifier 361-2, and converts the frequencies thereof. After the frequency mixers 363-1 and 363-2 perform frequency upconversion, the frequency mixers transfer output ports thereof to a mixer GM stage. The mixer GM stage may include the GM stages 365-1 and 365-2, and may be connected to the negative GM stage 367 (hereinafter, NGM), the variable resistor 369, and the variable capacitor 371, which are connected in parallel. The Tx up-mixer chain 360 may generate a signal for RF outputting, based on the mixer GM stage and the transformer 373 in the frequency mixers 363-1 and 363-2. For example, a k value of the transformer 373 may include 0.61. However, according to another embodiment, the k value of the transformer 373 may be changed according to a user configuration.

According to an embodiment, the Tx up-mixer chain 360 may receive a baseband signal in a voltage mode from the baseband node, based on a super source follower (SSF). Based on reception of an input signal, the Tx up-mixer chain 360 may operate an IF node of a passive double-balanced frequency mixer having a low impedance. The frequency mixers 363-1 and 363-2 may be operated based on LO signals transferred from the QSG 310 and signals transferred from the IF amplifier 361-1 and 361-2. According to an embodiment, the frequency mixers 363-1 and 363-2 include an in-phase mixer (I mixer) and a quadrature mixer (Q mixer). The Tx up-mixer chain 360 may operate the I mixer and the Q mixer to perform frequency upconversion. Voltage signals, the frequencies of which have been upconverted in the RF ports of the I mixer and the Q mixer may be converted into RF currents, based on the mixer GM stage.

The converted RF current signals are combined at a primary coil node of the transformer in a current mode. The transformer may form a Tx complex signal (I+jQ), based on an RF current signal, and may output an RF signal by magnetic-coupling the Tx complex signal to a single-ended secondary coil. According to an embodiment, the Tx up-mixer chain 360 may include the NGM 367 coupled to both terminals of a primary coil having a differential (balanced) structure in the transformer. According to various embodiments, the NGM 367 may be a circuit including two re-channel metal oxide semiconductors (NMOSs) arranged in a cross-coupled pair structure. The NGM 367 is configured to operate in a sub-threshold region. Therefore, the Tx up-mixer chain 360 may generate a component having the same size as that of a third harmonic component generating in a GM stage and having a different polarity to the same component. The Tx up-mixer chain 360 may remove a third harmonic component by using a component having the same size as that of the third harmonic component and having a different polarity to the same component.

According to an embodiment, a baseband I signal and a baseband Q signal, which are BB signals, are input to IF nodes of passive double-balanced frequency mixers (I mixer and Q mixer) having a relatively low impedance in a voltage mode by using an SSF. The QSG may generate I/Q LO signals having a rail-to-rail size and a duty ratio of a threshold value (about 0.25) or greater, and the Tx up-mixer chain may perform a function of upconverting the frequency of a BB signal through LO ports of the I mixer and the Q mixer, based on an operation of turning on or off a switch element configuring each mixer. A voltage signal, the frequency of which has been upconverted, may be converted into a current signal in a GM stage implemented as a cascode circuit, and an I signal and a Q signal converted into a current mode may be synthesized in the primary coil of the transformer, connected as a load in a differential (balanced) manner, so that a complex signal may be generated. A complex signal may be transferred to the secondary coil implemented to generate a single-ended signal, and the Tx up-mixer chain 360 may generate a synthesized output signal to a load connected to the secondary coil. According to an embodiment, the device for upconversion may include a passive mixer.

According to an embodiment, the Tx up-mixer chain 360 may combine an I signal and a Q signal in a current mode, and may operate the NGM 367 implemented as a pair of cross-coupled NMOSs in a sub-threshold region, so as to reduce a third harmonic component occurring a GM stage. According to an embodiment, a center frequency may be adjusted based on a capacitor bank including capacitors connected in parallel to both terminals of the primary coil of the transformer connected to a load of a GM stage. According to an embodiment, an LO input signal may include a signal having a frequency of about 20-23 GHz, an input resistance of the QSG to an LO input signal may be 50Ω, an input resistance of the Tx up-mixer chain to a baseband signal may be 1000Ω, and an RF output resistance of the Tx up-mixer chain may be 50Ω.

The device according to embodiments post-processes an upconverted signal through the negative GM stage to remove a harmonic component. A harmonic component is removed based on the negative GM stage, so that linearity is improved. According to various embodiments, removing of a harmonic component is not performed before upconversion, and a signal including a harmonic component is post-processed, so that higher linearity can be accomplished. Particularly, the negative GM stage implemented by an NMOS transistor operates in weak inversion, and thus improvement of linearity can be accomplished without additional power consumption.

According to various embodiments, a transistor includes a junction transistor (bipolar junction transistor, BJT) and a field effect transistor (FET). The FET includes a metal oxide semiconductor field effect transistor (MOSFET) using oxide as a dielectric, a metal semiconductor field effect transistor (MESFET) using intrinsic semiconductor, and a metal insulator semiconductor field effect transistor (MISFET) using an insulator. Hereinafter, the disclosure describes a circuit using a MOSFET, but a transistor performing the same functions may be implemented instead.

According to various embodiments, a MOSFET includes an n-channel metal oxide semiconductor (NMOS) forming an N-channel by doping an n-type source and an n-type drain on a p-type substrate, and a p-channel metal oxide semiconductor (PMOS) forming a P-channel by doping a p-type source and a p-type drain on an n-type substrate. The operation performance of a MOSFET may be determined based on W denoting a channel width and L denoting a channel length. The amount of current passing through a MOSFET may be adjusted according to a ratio between channel length L and channel width W, and parameter M relating to the operation performance of a MOSFET may be determined based on W and L.

According to various embodiments, a threshold voltage of a MOSFET is a voltage at which a channel starts to be formed in the MOSFET, and indicates a voltage at which a current starts to flow between the source and the drain when the voltage is applied to the gate. A sub-threshold region indicates a region in which leakage current flows in a region before the threshold voltage is applied. In the process in which a channel is formed in a MOSFET, if a voltage applied to the gate is increased, the energy band is bent at the semiconductor surface, and p-type and n-type may be inverted at the semiconductor/oxide layer interface. The degree of inversion may be divided into weak inversion and strong inversion, based on the difference between the intensities of electric fields.

According to various embodiments, a process in which a MOSFET operates in a sub-threshold region includes a process in which, if the intensity of the electric field of a depletion region of the transistor is reduced according to the increase in a voltage applied to the gate, the MOSFET operates in a weak inversion state with weak channel formation.

According to various embodiments, a transconductance (GM) of a transistor serves as a voltage-controlled current source and relates to a measure of the amplification factor of the transistor. In a BJT, the GM may indicate a ratio between base-emitter voltage and collector current, and in a FET, the GM may indicate a ratio between gate-source voltage and drain current. A GM stage may indicate a circuit serving as a voltage-controlled current source to amplify an input signal and output the amplified signal.

Hereinafter, an example of specific structures of the device 300 in FIG. 3 and operations of the device 300 will be described with reference to FIGS. 4 to 10.

Figure 4:
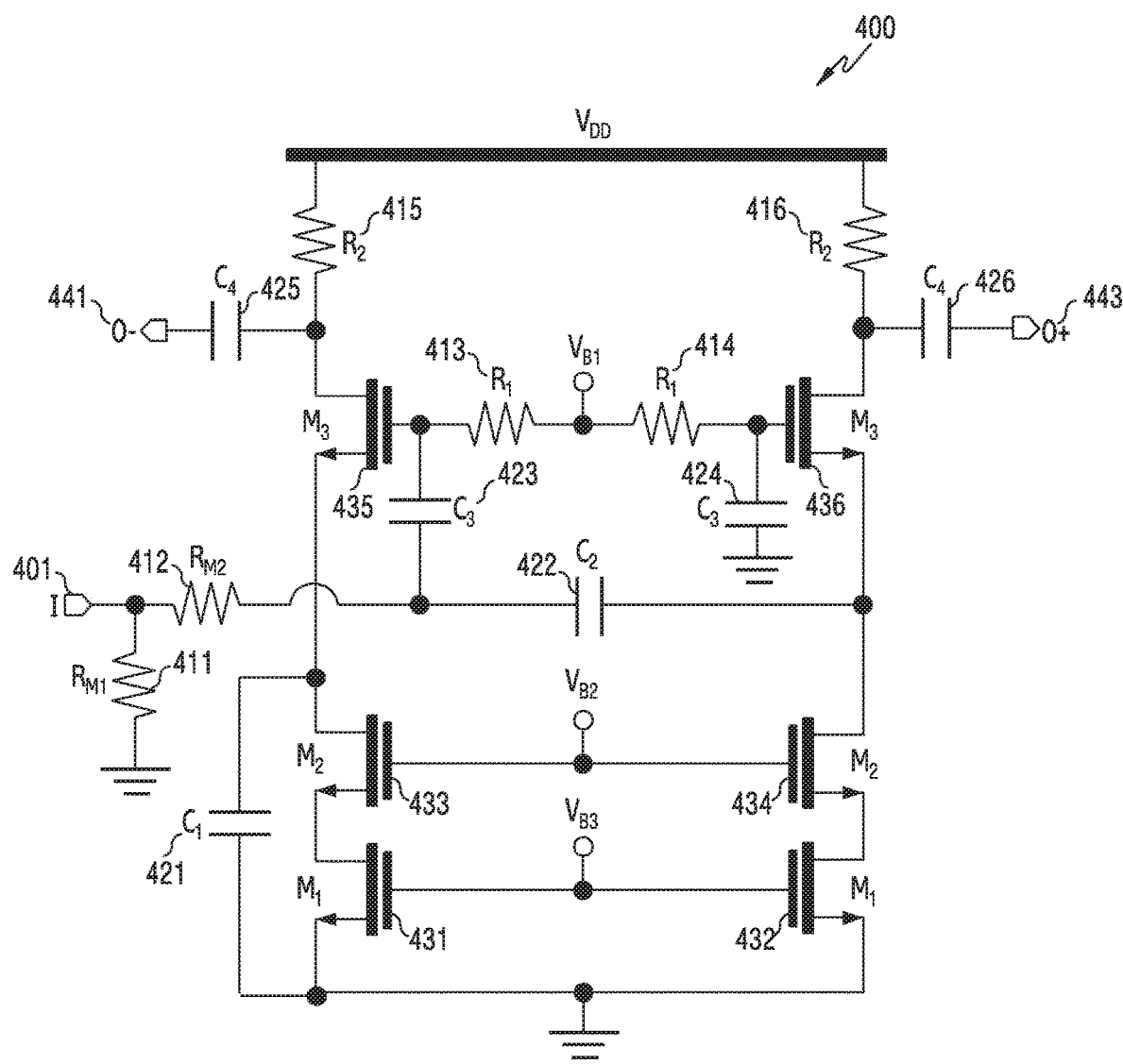
FIG. 4 illustrates a circuit configuring a balun in a wireless communication system according to an embodiment of the disclosure.

FIG. 4 illustrates a circuit configuring a balun in a wireless communication system according to an embodiment of the disclosure. The balun 400 is an example of the balun 311 of FIG. 3.

Referring to FIG. 4, a balun 400 may include resistors 411 to 416, capacitors 421 to 426, and transistors 431 to 436. FIG. 4 illustrates NMOSs as the transistors 431 to 436, but the NMOS transistors may be replaced with p-channel metal oxide semiconductors (PMOSs) performing the same functions.

According to an embodiment, the balun 400 receives an input signal, and outputs balanced signals to transfer the signals to the LO driver 313. The balun 400 receives an input signal from an input node 401, and outputs a signal through an output node 441 and an output node 443. The output nodes 441 and 443 are output nodes of the balun, and may be connected to one of input nodes of an LO driver in FIG. 5A. According to an embodiment, the balun 400 may be operated by a voltage applied to R2s 415 and 416, and a signal input from the input node includes an LO signal.

According to an embodiment, a part of the elements included in the balun 400 may be omitted. For example, element values of an element included in the balun may be determined through Table 1. However, Table 1 merely corresponds to an example of an element value of an element included in the balun, and may be changed according to a user configuration according to another embodiment.

TABLE 1

| Element | Element Value |
|---|---|
| $R_{M1}$ | 187 Ω |
| $R_{M2}$ | 23.4 Ω |
| $R_1$ | 50 kΩ |
| $R_2$ | 446 Ω |
| $C_1, C_2, C_3$ | 464 fF |
| $C_4$ | 208 fF |
| $M_1$ | 36 μm(W), 60 nm(L) |

TABLE 1-continued

| Element | Element Value |
|---|---|
| $M_2$ | 44 μm(W), 60 nm(L) |
| $M_3$ | 36 μm(W), 60 nm(L) |

Figure 5A:
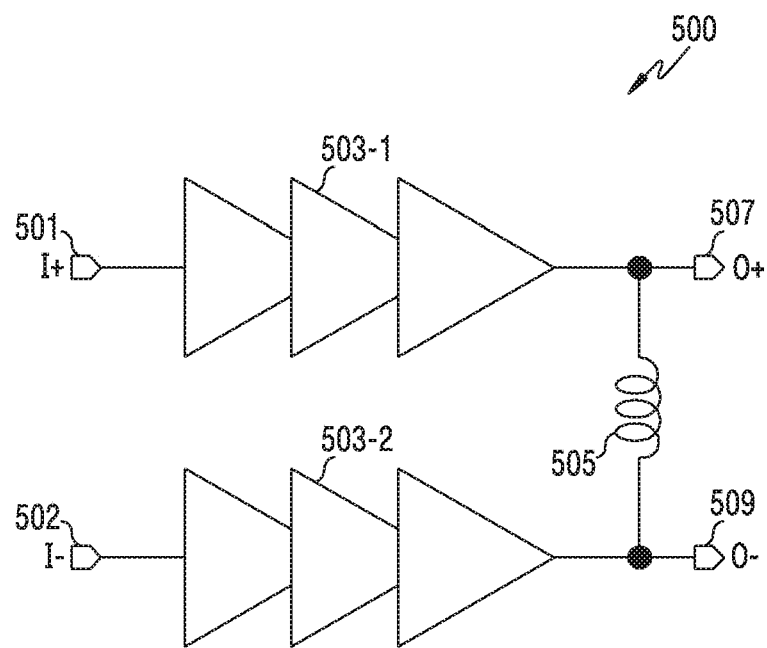
FIG. 5A illustrates a configuration of a local oscillator (LO) driver in a wireless communication system according to an embodiment of the disclosure.

FIG. 5A illustrates a configuration of a local oscillator (LO) driver in a wireless communication system according to an embodiment of the disclosure.

Referring to FIG. 5A, a LO driver 500 includes input nodes 501 and 502, LO drivers 503-1 and 503-2, output nodes 507 and 509, and an inductor 505.

According to an embodiment, the positive (+) terminal input node 501 may be connected to the positive (+) terminal output node 507 through the first LO driver 503-1, and the negative (−) terminal input node 502 may be connected to the negative (−) terminal output node 509 through the second LO driver 503-2. The inductor 505 may be connected between the + terminal output node 507 and the − terminal output node 509.

FIG. 5A illustrates a 3-stage LO driver, but embodiments are not limited thereto. According to another embodiment, the LO driver may be implemented in a plurality of stages rather than 3-stages. In addition, according to an embodiment, a part of the elements included in the LO driver 500 may be omitted. According to an embodiment, the inductor 505 may have an element value of about 650 pH. However, the element value of about 650 pH merely corresponds to an example of an element value of an element included in the LO driver, and may be changed according to a user configuration.

Figure 5B:
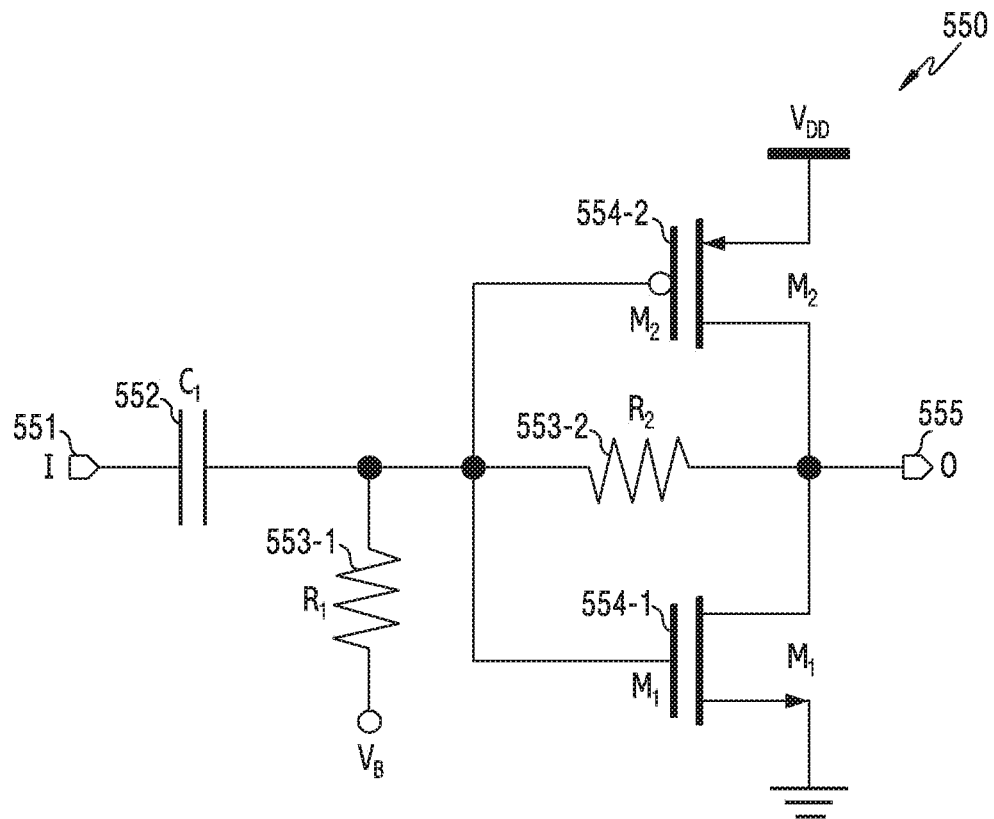
FIG. 5B illustrates a circuit configuring a local oscillator (LO) driver in a wireless communication system according to an embodiment of the disclosure.

FIG. 5B illustrates a circuit configuring a local oscillator (LO) driver in a wireless communication system according to an embodiment of the disclosure. FIG. 5B illustrates an example of a circuit configuring the first LO driver 503-1 and/or the second LO driver 503-2 illustrated in FIG. 5A.

Referring to FIG. 5B, a LO driver configuration circuit 550 may include resistors 553-1 and 553-2, a capacitor 552, and transistors 554-1 and 554-2. FIG. 5B illustrates an NMOS and a PMOS as the transistors 554-1 and 554-2, but the NMOS and the PMOS may be replaced with a PMOS and an NMOS performing the same functions, respectively.

According to an embodiment, the LO driver configuration circuit 550 receives an input signal from an input node 551. Balanced signals output from the output nodes 441 and 443 of the balun 400 are transferred to the input nodes of the LO driver. The LO driver configuration circuit 550 generates an output signal to be input to a frequency divider and outputs the signal through an output node 555. The output node 555 of the LO driver configuration circuit 550 may be connected to one of an input node of another LO driver or an input node of the frequency divider.

According to an embodiment, a part of the elements included in the LO driver configuration circuit 550 may be omitted. For example, element values of an element included in the LO driver configuration circuit may be determined through Table 2. However, Table 2 merely corresponds to an example of an element value of an element included in the LO driver configuration circuit, and may be changed according to a user configuration according to another embodiment.

TABLE 2

| Element | Element Value |
|---|---|
| $R_1$ | 11 kΩ |
| $R_2$ | 6.6 kΩ |
| $C_1$ | 219.5 fF |
| $M_1$ | 16 μm(W), 60 nm(L) |
| $M_2$ | 24 μm(W), 60 nm(L) |

Figure 6:
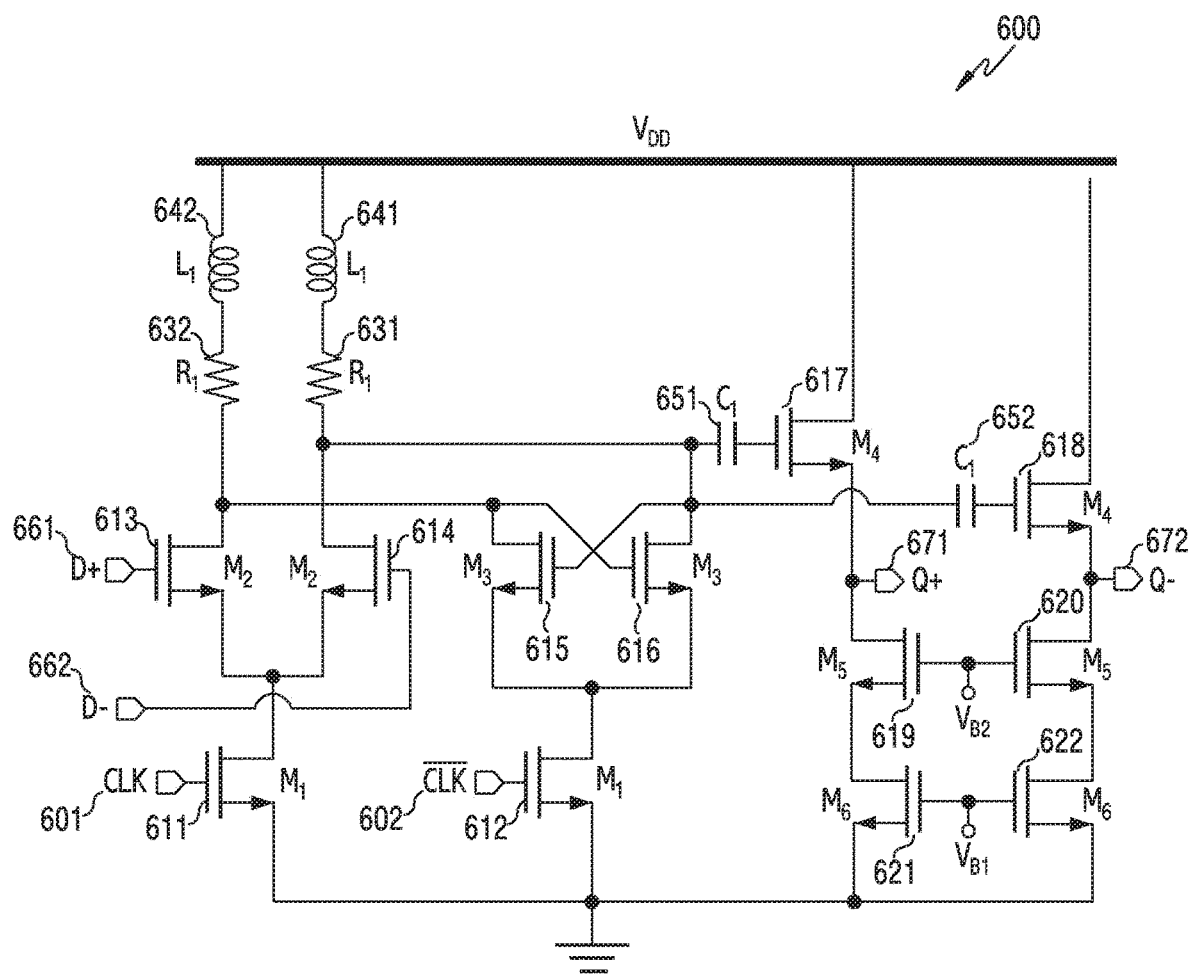
FIG. 6 illustrates a circuit configuring a current-mode logic (CML) latch in a wireless communication system according to an embodiment of the disclosure

FIG. 6 illustrates a circuit configuring a current-mode logic (CML) latch in a wireless communication system according to an embodiment of the disclosure. FIG. 6 illustrates a circuit configuring a CML latch included in the frequency divider 317 illustrated in FIG. 3.

Referring to FIG. 6, a CML latch 600 may include transistors 611 to 622, resistors 631 and 632, inductors 641 and 642, and capacitors 651 and 652. FIG. 6 illustrates NMOSs as the transistors 554-1 and 554-2, but the NMOSs may be replaced with PMOSs performing the same functions.

According to an embodiment, a signal having passed through the balun 400 and the LO driver 500 is input to clock nodes 601 and 602 of the latch. A signal output through the output nodes 507 and 509 of the LO driver is input to the clock nodes of the latch. According to an embodiment, the circuit of the latch outputs a signal through a D+ node 661, a D− node 662, a Q+ node 671, and a Q− node 672.

Figure 7A:
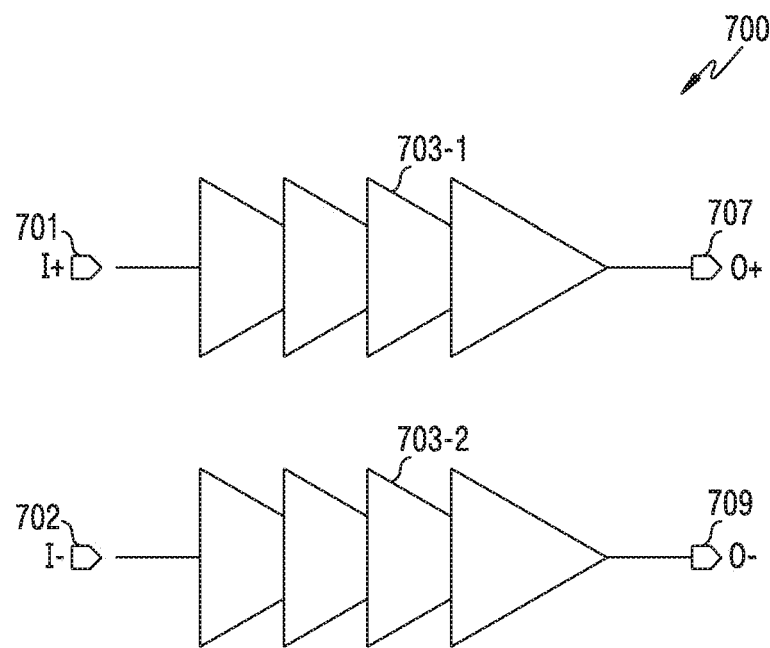
FIG. 7A illustrates a configuration of an LO buffer in a wireless communication system according to an embodiment of the disclosure.
Figure 7B:
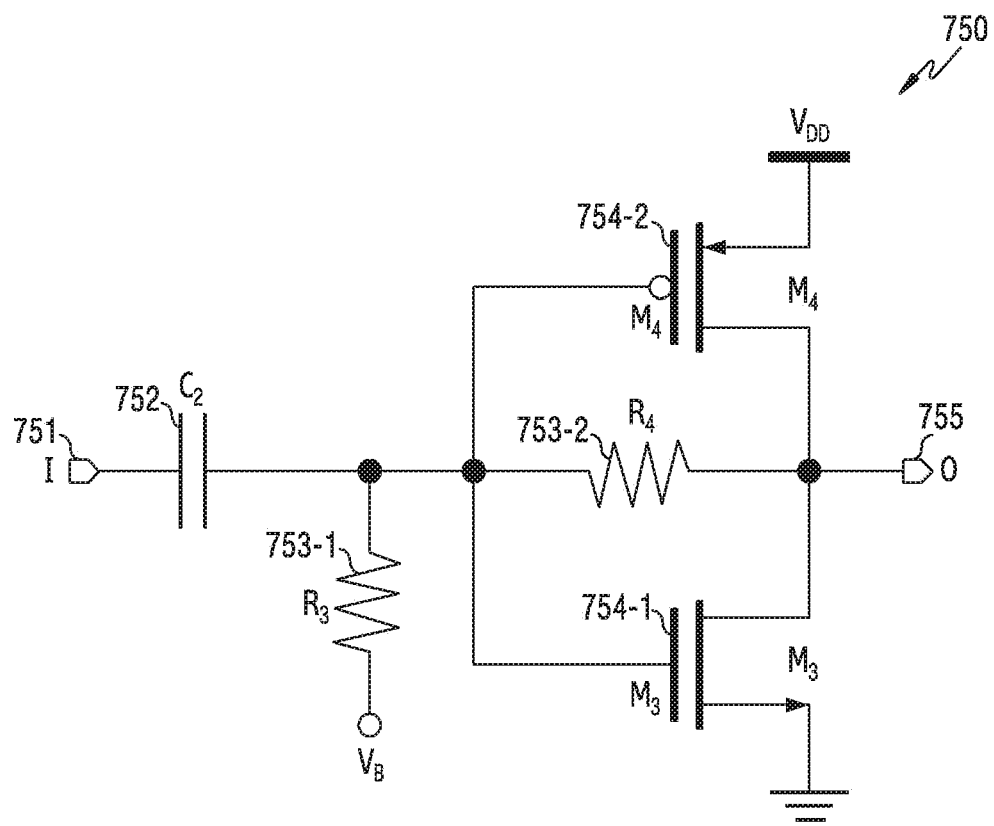
FIG. 7B illustrates a circuit configuring an LO buffer in a wireless communication system according to an embodiment of the disclosure.

The frequency divider 317 may include a plurality of CML latches, and the plurality of CML latches may be connected in a cross-coupling manner According to an embodiment, the Q+ node of a first CML latch may be connected to an input node 701 of an LO buffer illustrated in FIGS. 7A and 7B, and the D+ node of a second CML latch. The Q− node of the first CML latch may be connected to an input node 702 of the LO buffer illustrated in FIGS. 7A and 7B, and the D− node of the second CML latch. The Q+ node of the second CML latch may be connected to the input node 701 of the LO buffer illustrated in FIGS. 7A and 7B, and the D− node of the first CML latch. The Q− node of the second CML latch may be connected to the input node 702 of the LO buffer illustrated in FIGS. 7A and 7B, and the D+ node of the first CML latch.

According to an embodiment, a part of the elements included in the CML latch 600 configuration circuit may be omitted. For example, element values of an element included in the CML latch configuration circuit may be determined through Table 3. However, Table 3 merely corresponds to an example of an element value of an element included in the CML latch configuration circuit, and may be changed according to a user configuration according to another embodiment.

TABLE 3

| Element | Element Value |
|---|---|
| $R_1$ | 200 Ω |
| $L_1$ | 550 pH |
| $C_1$ | 172.5 fF |
| $M_1$ | 33.6 μm(W), 60 nm(L) |
| $M_2$ | 12.6 μm(W), 60 nm(L) |
| $M_3$ | 4.2 μm(W), 60 nm(L) |
| $M_4$ | 20 μm(W), 60 nm(L) |
| $M_5$ | 42 μm(W), 60 nm(L) |

FIG. 7A illustrates a configuration of an LO buffer in a wireless communication system according to an embodiment of the disclosure.

Referring to FIG. 7A, a configuration of the LO buffer 700 includes input nodes 701 and 702, LO buffers 703-1 and 703-2, and output nodes 707 and 709.

According to an embodiment, the positive (+) terminal input node 701 may be connected to the positive (+) terminal output node 707 through the first LO buffer 703-1, and the negative (−) terminal input node 702 may be connected to the negative (−) terminal output node 709 through the second LO buffer 703-2.

FIG. 7A illustrates a 4-stage LO buffer, but embodiments are not limited thereto. According to another embodiment, the LO buffer may be implemented in a plurality of stages rather than 4-stages. In addition, according to another embodiment, a part of the elements included in the LO buffer 700 may be omitted. However, the 4-stage LO buffer merely corresponds to an example of an element value of an element included in the LO buffer, and may be changed according to a user configuration according to another embodiment.

FIG. 7B illustrates a circuit configuring an LO buffer in a wireless communication system according to an embodiment of the disclosure. FIG. 7B illustrates an example of a circuit configuring the first LO buffer 703-1 and/or the second LO buffer 703-2 illustrated in FIG. 7A.

Referring to FIG. 7B, a LO buffer configuration circuit 750 may include resistors 753-1 and 753-2, a capacitor 752, and transistors 754-1 and 754-2. FIG. 7B illustrates an NMOS and a PMOS as the transistors 754-1 and 754-2, but the NMOS and the PMOS may be replaced with a PMOS and an NMOS performing the same functions, respectively.

According to an embodiment, the LO buffer configuration circuit 750 receives an input signal from an input node 751. Signals output from the output nodes 661, 662, 671, and 672 of the latch are transferred to an input node of an LO buffer. The LO driver configuration circuit 550 generates an output signal to be input to the frequency divider and outputs the signal through an output node 755. The LO buffer configuration circuit may operate by a voltage applied to a source of M4 854-2. The output node 755 is an output node of the LO buffer configuration circuit, and may be connected to one of an input node of another LO buffer or an input node of a frequency mixer.

According to an embodiment, a part of the elements included in the LO buffer configuration circuit 750 may be omitted. For example, element values of an element included in the LO buffer configuration circuit may be determined through Table 4. However, Table 4 merely corresponds to an example of an element value of an element included in the LO buffer configuration circuit, and may be changed according to a user configuration according to another embodiment.

TABLE 4

| Element | Element Value |
|---|---|
| $R_3$ | 11 kΩ |
| $R_4$ | 6.6 kΩ |
| $C_2$ | 158.4 fF |
| $M_3$ | 7.2 μm(W), 60 nm(L) |
| $M_4$ | 12 μm(W), 60 nm(L) |

Figure 8:
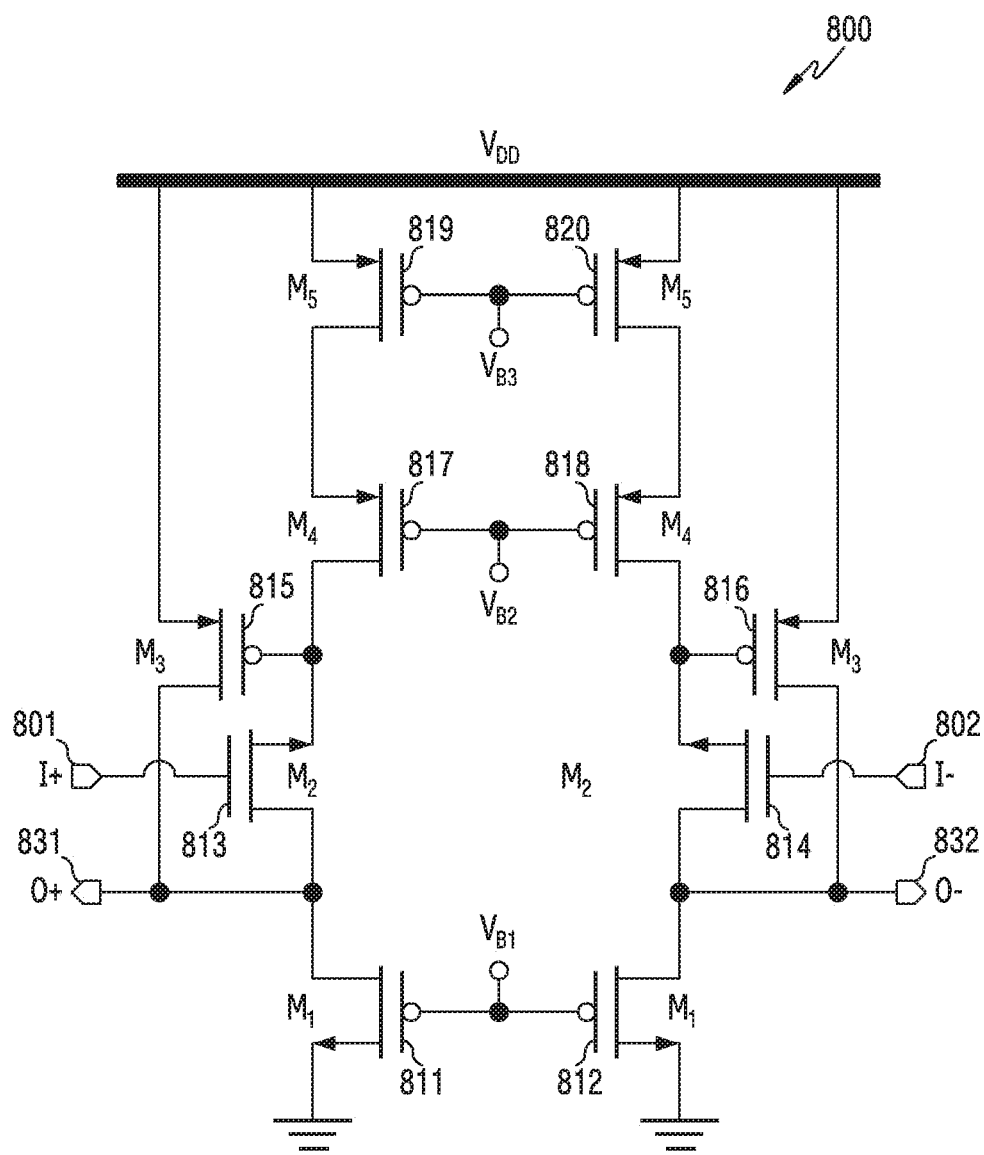
FIG. 8 illustrates a circuit configuring an intermediate frequency (IF) amplification unit in a wireless communication system according to an embodiment of the disclosure.

FIG. 8 illustrates an example of a circuit configuring an intermediate frequency (IF) amplification unit in a wireless communication system according to an embodiment of the disclosure. The IF amplification unit is an example of the IF input unit 101 of FIG. 1.

Referring to FIG. 8, an IF amplification unit 800 performs a function of amplifying an IF signal, and may include an IF local oscillator (LO), an IF mixer, an IF amplifier, and a channel selection filter. The IF LO performs a function of supplying an LO frequency to the IF amplifier for converting a baseband signal into an IF signal. The IF mixer performs a function of generating an IF signal, based on a baseband signal and an IF LO signal. The IF amplifier performs a function of amplifying an IF signal, and the channel selection filter performs a function of selecting a band corresponding to a required channel according to a configuration through band pass filtering. The IF amplification unit 800 may generate an IF signal, based on a baseband signal and an LO signal. The IF amplification unit 800 may amplify a generated IF signal through the IF amplifier, and output an IF signal corresponding to a required band.

According to an embodiment, the IF amplification unit 800 may include transistors 811 to 820. FIG. 8 illustrates NMOSs and PMOSs as the transistors 811 and 820, but the NMOSs and the PMOSs may be replaced with PMOSs and NMOSs performing the same functions, respectively.

According to an embodiment, the IF amplification unit 800 may receive a signal from a + input node 801 and a − input node 802, and may output an input signal through a + output node 831 and a − output node 832. The + output node 831 and the − output node 832 may be connected to an IF + input node 911 and an IF − input node 912 of a mixer for frequency conversion, illustrated in FIG. 9.

According to an embodiment, a part of the elements included in a configuration circuit of the IF amplification unit 800 may be omitted. Element values of an element included in the IF amplifier may be determined through Table 5. However, Table 5 merely corresponds to an example of an element value of an element included in the IF amplifier, and may be changed according to a user configuration according to another embodiment.

TABLE 5

| Element | Element Value |
|---|---|
| $M_1$ | 33.6 μm(W), 60 nm(L) |
| $M_2$ | 12.6 μm(W), 60 nm(L) |
| $M_3$ | 4.2 μm(W), 60 nm(L) |
| $M_4$ | 20 μm(W), 60 nm(L) |
| $M_5$ | 42 μm(W), 60 nm(L) |

Figure 9:
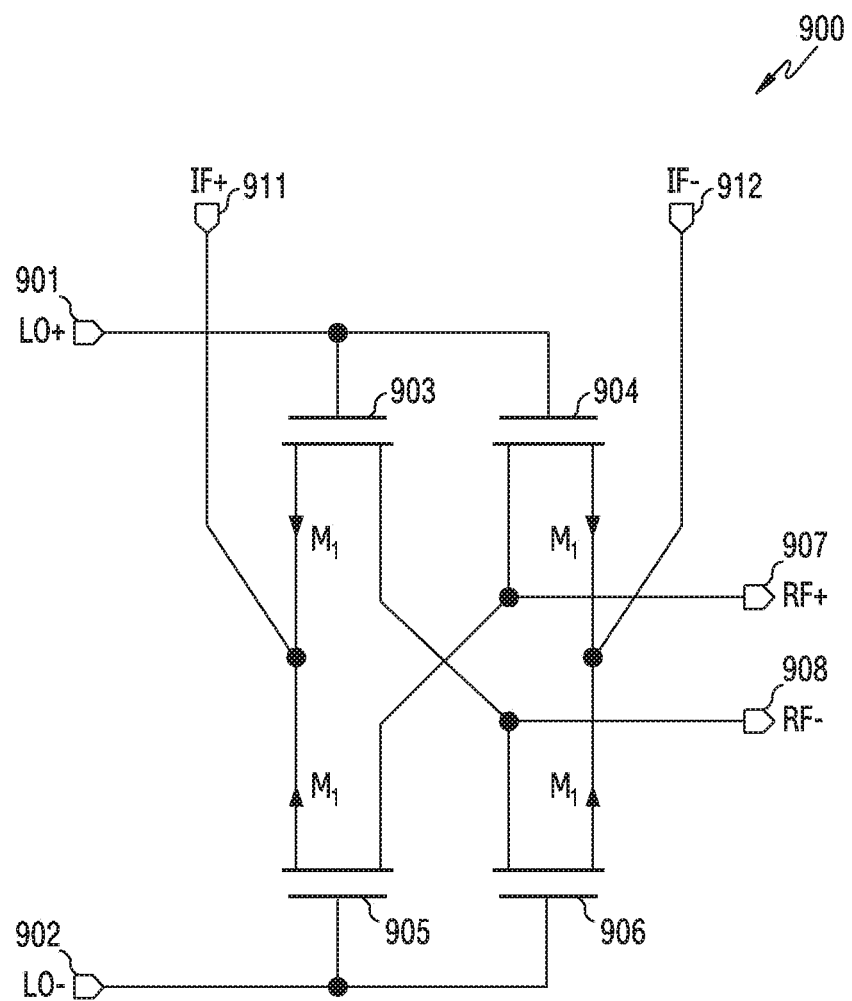
FIG. 9 illustrates a circuit configuring a mixer in a wireless communication system according to an embodiment of the disclosure.

FIG. 9 illustrates an example of a circuit configuring a mixer in a wireless communication system according to an embodiment of the disclosure. The mixer 900 is an example of the mixer 105 of FIG. 1.

Referring to FIG. 9, a mixer 900 performs a function of frequency conversion to an RF signal, based on an LO signal and an IF signal. The mixer may generate an RF signal by mixing an IF signal generated based on a baseband signal, and an LO signal transferred from the QSG.

According to an embodiment, the mixer 900 may include transistors 903 to 906. FIG. 9 illustrates NMOSs as the transistors 903 to 906, but the NMOSs may be replaced with PMOSs performing the same functions.

According to an embodiment, the mixer 900 may receive an LO signal from an LO + input node 901 and an LO − input node 902. The mixer 900 may receive an IF signal from an IF + input node 911 and an IF − input node 912. The mixer 900 may generate an RF signal by mixing the input signals. A generated RF signal may be output through an RF + output node 907 and an RF − output node 908. According to an embodiment, the LO input nodes 901 and 902 may be connected to the output nodes 707 and 709 of the LO buffer 700, and the IF input nodes 911 and 912 may be connected to the output nodes 831 and 832 of the IF amplification unit 800, respectively.

According to an embodiment, a part of the elements included in the circuit configuring the mixer 900 may be omitted. For example, element values of an element included in the mixer may be determined through Table 6. However, Table 6 merely corresponds to an example of an element value of an element included in the mixer, and may be changed according to a user configuration according to another embodiment.

TABLE 6

| Element | Element Value |
| --- | --- |
| $M_1$ | 15 μm(W), 60 nm(L) |

Figure 10:
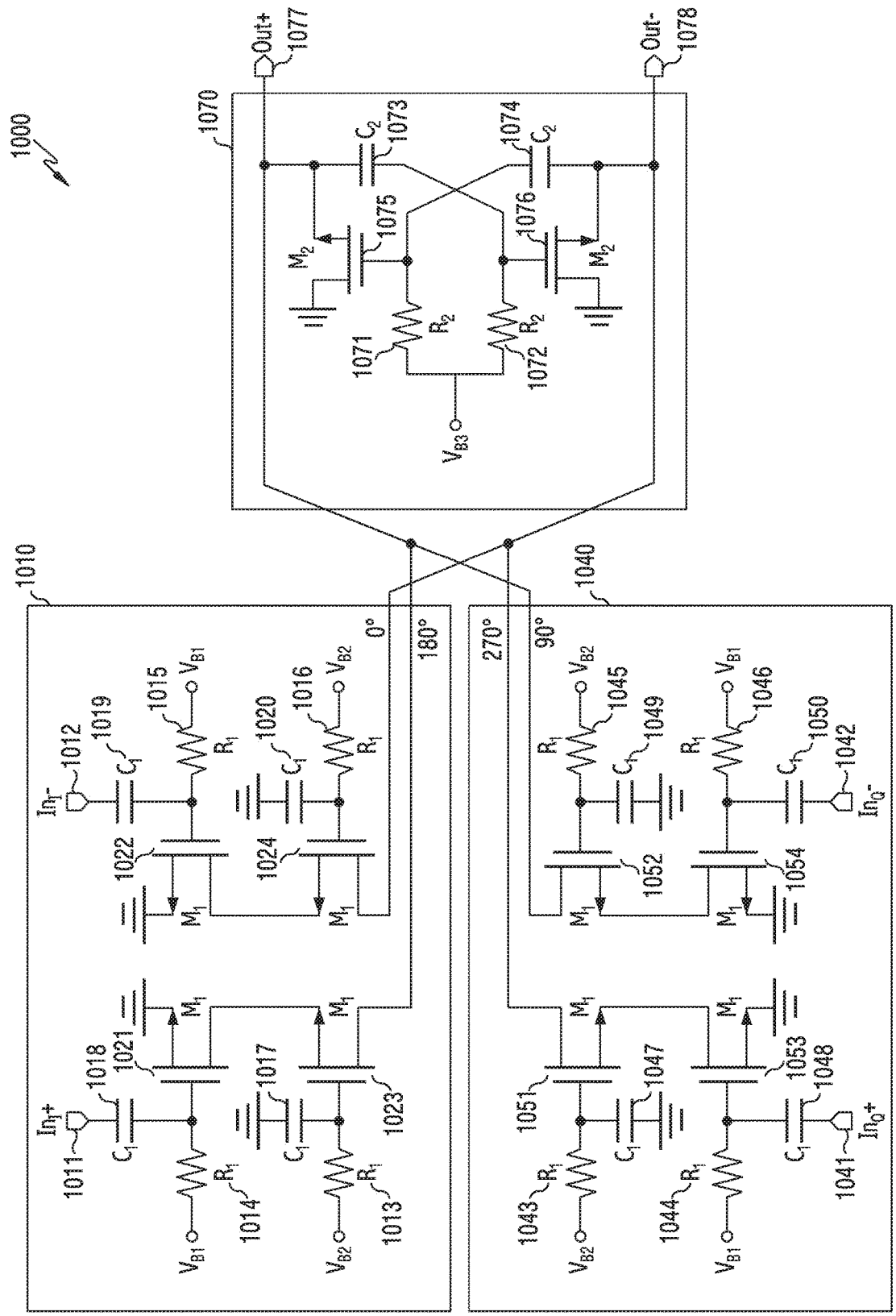
FIG. 10 illustrates a circuit of a chain using a mixer transconductance (GM) stage and a negative GM stage (NGM) in a wireless communication system according to an embodiment of the disclosure.

FIG. 10 illustrates a circuit of a chain using a mixer transconductance (GM) stage and a negative GM stage (NGM) in a wireless communication system according to an embodiment of the disclosure.

Referring to FIG. 10, a chain 1000 includes a first GM 1010, a second GM 1040, and a negative transconductance (NGM) 1070. The first GM 1010 and the second GM 1040 may perform a function of receiving a voltage signal, the frequency of which has been upconverted by mixers, and converting the input signal into an RF current signal. The NGM 1070 may perform a function of removing a harmonic component occurring with respect to the first GM and the second GM.

According to an embodiment, the first GM 1010 may include resistors 1013 to 1016, capacitors 1017 to 1020, and transistors 1021 to 1024. The first GM receives a signal from an InI + input node 1011 and an InI − input node 1012. The first GM generate a signal converted to an RF current, based on an input signal, and the generated signal is output through an Out + 1077 and an Out − 1078.

According to an embodiment, the second GM 1040 may include resistors 1043 to 1046, capacitors 1047 to 1050, and transistors 1051 to 1054. The second GM receives a signal from an InQ + input node 1041 and an InQ − input node 1042. The second GM generate a signal converted to an RF current, based on an input signal, and the generated signal is output through an Out − 1078 and an Out + 1077.

According to an embodiment, the NGM 1070 may include resistors 1071 to 1072, capacitors 1073 to 1074, and transistors 1075 to 1076. The NGM 1070 may be configured such that a negative resistance implemented by a pair of cross-coupled NMOSs is connected in parallel to both terminals of a resistor, and operates in a sub-threshold region. The NGM 1070 generates a removal component having the same size as that of a third harmonic component and having a different polarity to the harmonic component, the third harmonic component occurring in a cascode circuit applied to implement the first GM and the second GM. The removal component generated by the NGM 1070 may perform a function of reducing a third harmonic component occurring in a GM.

According to an embodiment stage, a part of the elements included in the chain 1000 using a mixer GM stage and a negative GM state may be omitted. For example, element values of an element included in the chain may be determined through Table 7. However, Table 7 merely corresponds to an example of an element value of an element included in the chain 1000, and may be changed according to a user configuration according to another embodiment.

TABLE 7

| Element | Element Value |
| --- | --- |
| $R_1$ | 50 kΩ |
| $R_2$ | 50 kΩ |
| $C_1$ | 1.3 pF |
| $C_2$ | 54 fF |
| $M_1$ | 45 μm(W), 60 nm(L) |
| $M_2$ | 13 μm(W), 60 nm(L) |

Figure 11:
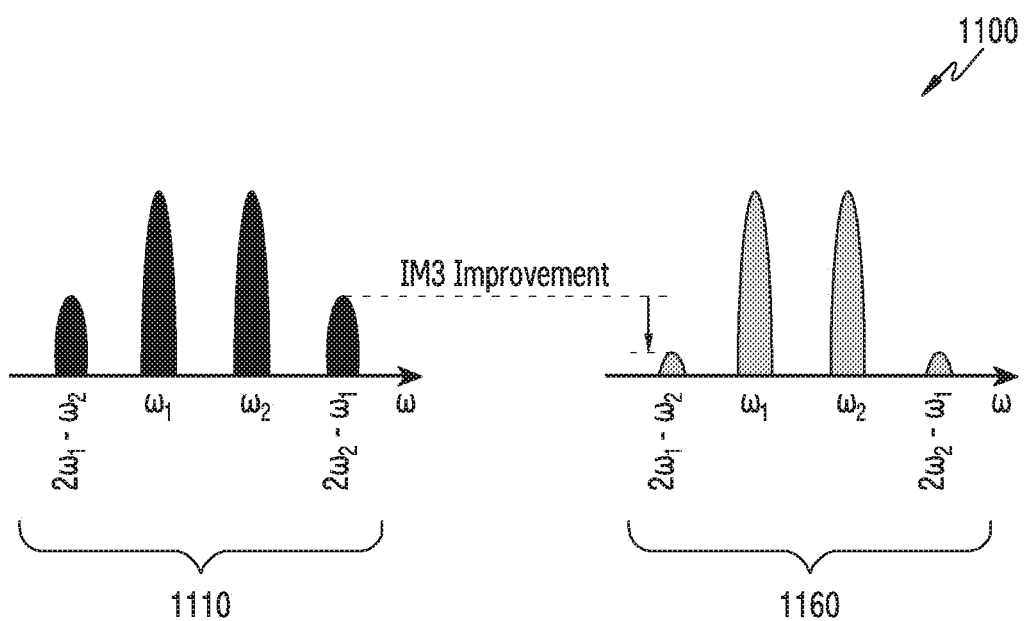
FIG. 11 illustrates a graph showing a change in intermodulation according to frequency in a wireless communication system according to an embodiment of the disclosure.

FIG. 11 illustrates a graph showing a change in intermodulation according to frequency in a wireless communication system according to an embodiment of the disclosure. When a signal having a frequency passes through a non-linear element, intermodulation occurs, and thus intermodulation distortion (IMD) can be measured.

Referring to FIG. 11 illustrating graph 1100, a measurement result 1110 indicates the magnitude of a gain of a signal having passed through a GM stage. A measurement result 1160 indicates the magnitude of a gain of a signal having passed through the NGM 1070. Each of the measurement results indicates a change in 3rd intermodulation distortion (IM3).

The measurement result 1110 indicates the magnitude of an intermodulation component with respect to a third harmonic occurring according to passage of a signal having a frequency of $w_1$ and $w_2$ through a non-linear element, the signal having passed through a GM stage. The measurement result 1160 indicates the magnitude of an intermodulation component with respect to a third harmonic occurring according to passage of a signal having a frequency of $w_1$ and $w_2$ through a non-linear element the signal having passed through the NGM stage.

A transistor has a non-linear characteristic implying an inconstant ratio between input and output. Output signal Y according to the passage of input signal X through a non-linear element may be expressed as Equation 1.

$$y = ax + bx^2 + cx^3 \qquad \text{Equation 1}$$

In a case where an input signal having a frequency of $w_1$ and $w_2$ is expressed by $x_1 = A\cos w_1 t + B\cos w_2 t$, if input signal $x_1$ is put in Equation 1, output signal $y_1$ includes a component relating to $w_1$, $w_2$, $w_1+w_2$, $w_1-w_2$, $2w_1+w_2$, $w_1+2w_2$, $2w_1-w_2$, $2w_2-w_1$ frequency. FIG. 11 illustrates an example of the intensity of a signal when a frequency is frequency $w_1$, $w_2$ identical to an input frequency, and the magnitude of a signal gain when a frequency is frequency $2w_1-w_2$, $2w_2-w_1$ corresponding to a third harmonic component. In addition, a sub-threshold region indicates a region in which leakage current flows in a region before the threshold voltage is applied. In the process in which a channel is formed in a MOSFET, if a voltage applied to the gate is increased, inversion occurs. Signals including a third harmonic component may be input to the NGM, and a frequency $2w_1-w_2$, $2w_2-w_1$ signal corresponding to a third harmonic component may be offset based on inversion occurring in the NGM operating in a sub-threshold region. Therefore, IM3 of a signal having passed through the NGM 1070 decreases with respect to a frequency related to a third harmonic component. Referring to FIG. 11, it is noted that a performance related to harmonic component removal is improved.

Figure 12A:
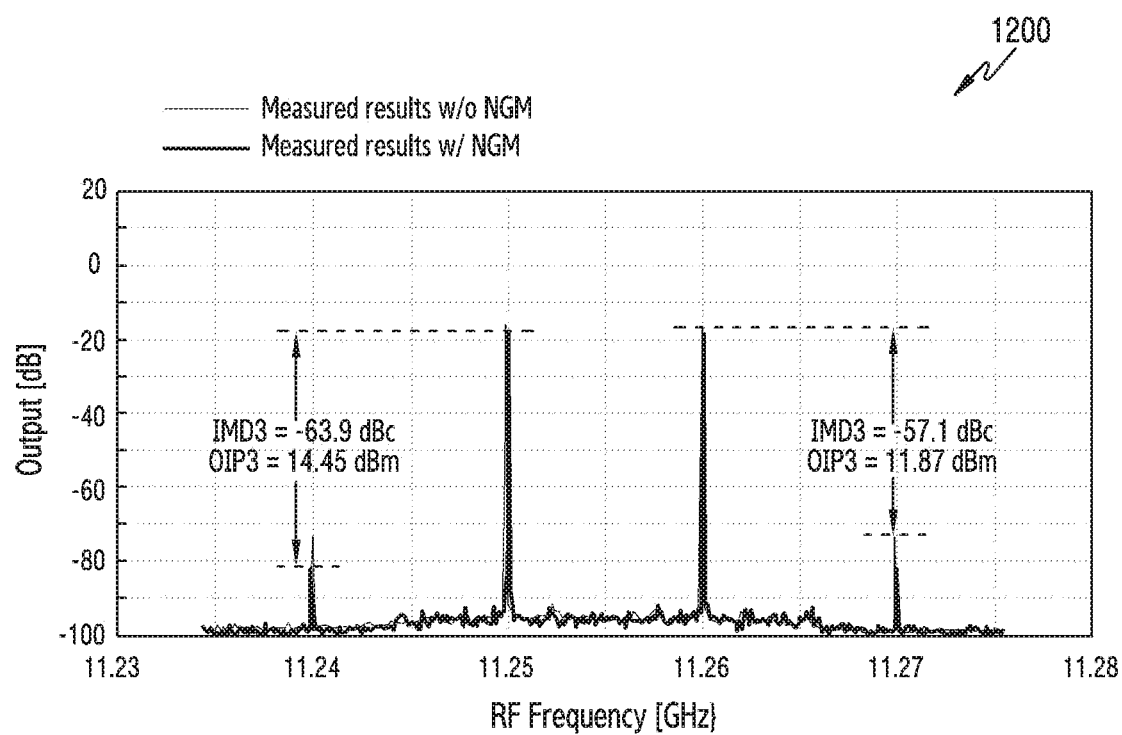
FIG. 12A illustrates a graph showing IM3 and a 3rd order intercept point (OIP3) according to a frequency when the frequency is upconverted in a wireless communication system according to an embodiment of the disclosure.

FIG. 12A illustrates a graph showing IM3 and a 3rd order intercept point (OIP3) according to a frequency when the frequency is upconverted in a wireless communication system according to an embodiment of the disclosure.

Referring to FIG. 12A, the graph 1200 shows the magnitude of a gain of an output signal relative to an input frequency. The horizontal axis indicates an RF frequency (unit: GHz) and the vertical axis indicates an output gain (unit: dB). The graph 1200 illustrates the magnitude of a gain of an output signal before and after passage through the NGM 1070 with respect to 11.25 GHz and 11.26 GHz frequency signals. The thin solid line indicates a gain value of an output signal before passage through the NGM, and the thick solid line illustrates a gain value of an output signal after passage through the NGM. Referring to FIG. 12A, with respect to an output signal in a 11.24 GHz and 11.27 GHz frequency region related to a third harmonic component, the gain of the output is reduced after the use of the NGM, compared to before the use of the NGM. According to an embodiment, in the case of a signal having a frequency of 11.24 GHz, IM3 and OIP3 are improved to −63.9 dBc and 14.45 dBm, compared to a 11.24 GHz signal, respectively. In the case of a signal having a frequency of 11.27 GHz, IM3 and OIP3 are improved to −57.1 dBc and 11.87 dBm, compared to a 11.26 GHz signal, respectively.

Figure 12B:
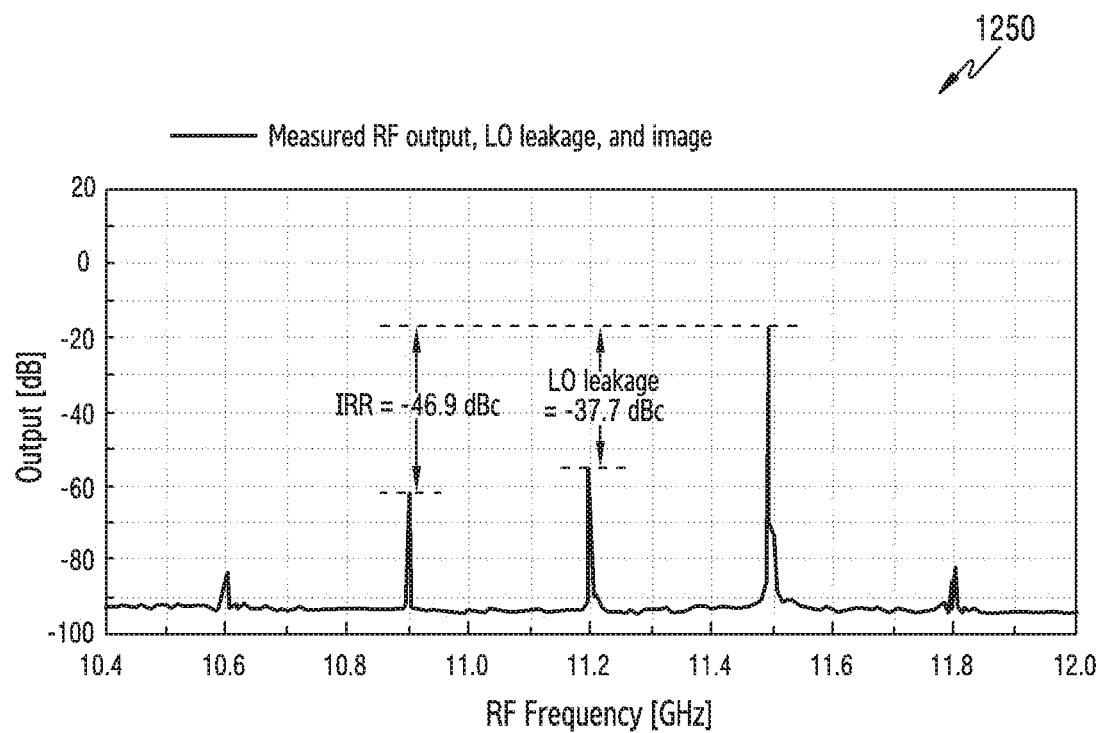
FIG. 12B illustrates a graph showing an image rejection ratio (IRR) according to a frequency when the frequency is upconverted in a wireless communication system according to an embodiment of the disclosure.

FIG. 12B illustrates a graph showing an image rejection ratio (IRR) according to a frequency when the frequency is upconverted in a wireless communication system according to an embodiment of the disclosure.

Referring to FIG. 12B, a graph 1250 shows the magnitude of a gain of an output signal relative to an input frequency. The horizontal axis indicates an RF frequency (unit: GHz) and the vertical axis indicates an output gain (unit: dB). The graph 1250 shows the magnitude of a gain of an output signal according to an RF output frequency when frequency upconversion is performed. If the NGM is used, it is noted that IRR is improved to −46.9 dBc, and LO leakage is improved to −37.7 dBc.

Figure 13A:
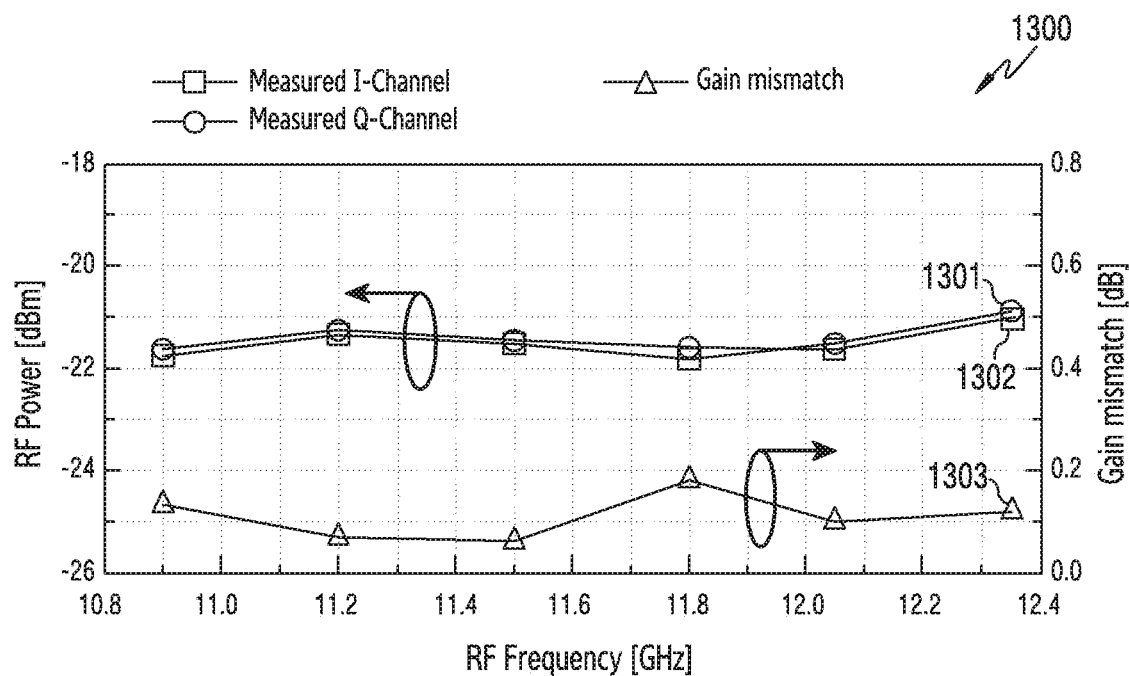
FIG. 13A illustrates a graph showing a gain mismatch value and the strength of an output signal in an I/Q channel according to a frequency when the frequency is upconverted in a wireless communication system according to an embodiment of the disclosure.

FIG. 13A illustrates a graph showing a gain mismatch value and the strength of an output signal in an I/Q channel according to a frequency when the frequency is upconverted in a wireless communication system according to an embodiment of the disclosure.

Referring to FIG. 13A, a graph 1300 shows the intensity of power of an output signal relative to an input frequency. The horizontal axis indicates an RF frequency (unit: GHz) and the vertical axis indicates an output (unit: dBm). The graph 1300 illustrates the intensity 1302 of an RF output signal upconverted in an I channel, the intensity 1301 of an RF output signal upconverted in a Q channel, and the magnitude 1303 of a gain mismatch between an RF output signal related to the I channel and an RF output signal related to the Q channel Referring to FIG. 13A, a gain mismatch value does not exceed 0.1 dB at 11.2 GHz, so that it is noted that a signal gain error is reduced.

Figure 13B:
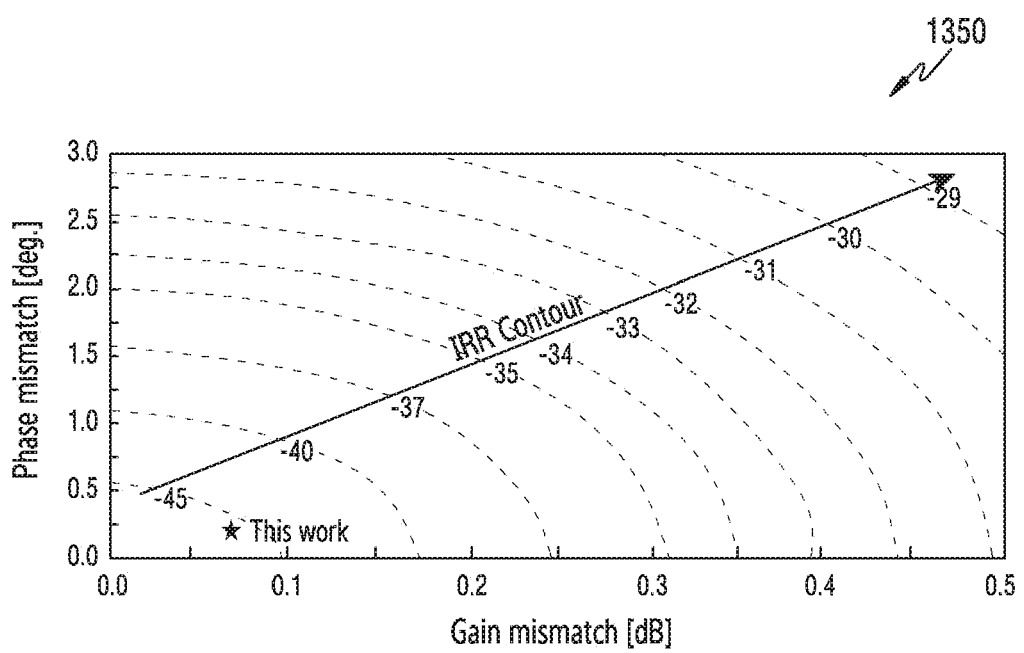
FIG. 13B illustrates a graph showing a phase mismatch according to a gain mismatch when frequency is upconverted in a wireless communication system according to an embodiment of the disclosure.

FIG. 13B illustrates a graph showing a phase mismatch according to a gain mismatch when frequency is upconverted in a wireless communication system according to an embodiment of the disclosure.

Referring to FIG. 13B, in a graph 1350, the horizontal axis indicates a gain mismatch (unit: dB) and the vertical axis indicates a phase mismatch (unit: degree)) (°. In relation to a gain mismatch value, a contour is used to determine a phase mismatch. According to various embodiments, if a gain mismatch is 0.1 dB, it is noted that IRR is determined to be a value between −40 to −45, and a phase mismatch is determined to be 0.5 or lower.

Figure 14:
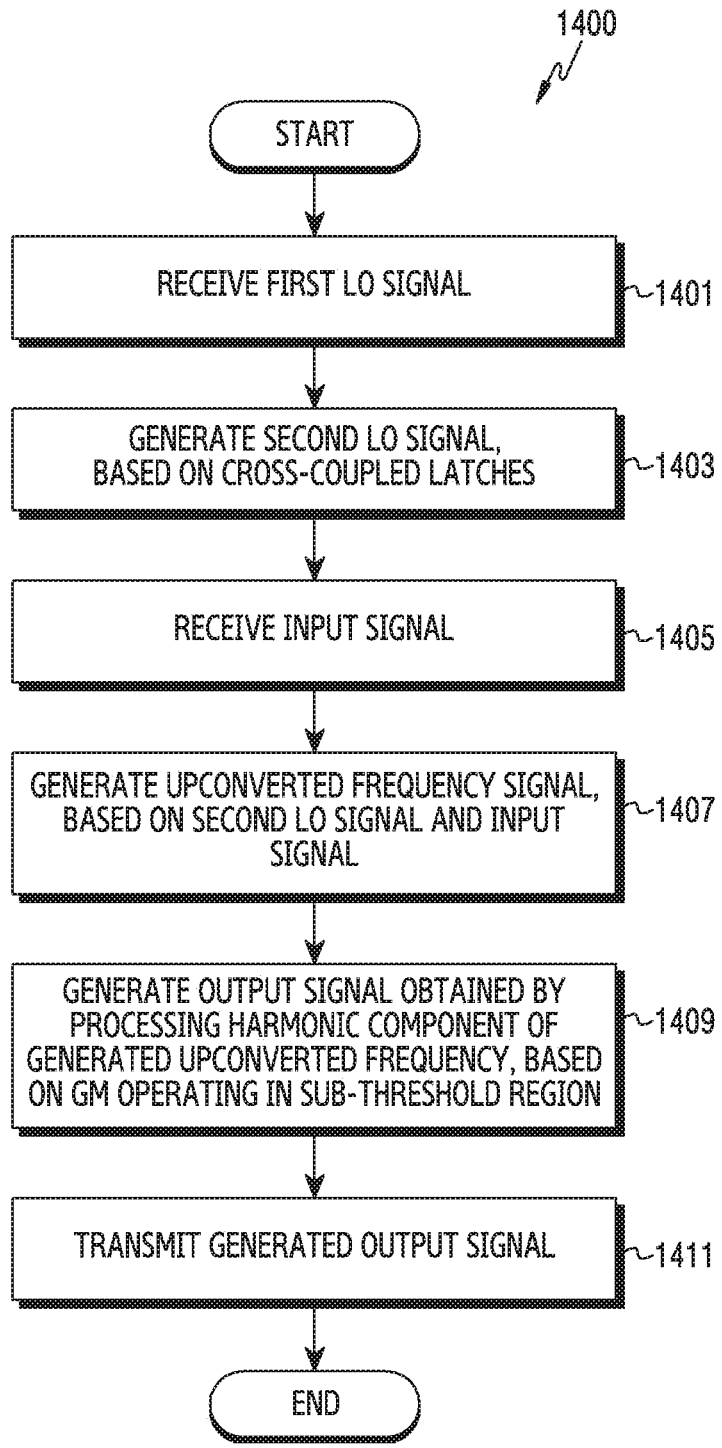
FIG. 14 is a flowchart of an operation of a device for upconverting frequency in a wireless communication system according to an embodiment of the disclosure.

FIG. 14 is a flowchart of an operation of a device for upconverting frequency in a wireless communication system according to an embodiment of the disclosure. FIG. 14 illustrates an operation method of a device.

Referring to FIG. 14, in operation 1401 of flowchart 1400, the device receives a first local oscillator (LO) signal. The device receives a first LO signal performing a function of a reference signal for generating a second LO signal used for frequency upconversion.

In operation 1403, the device generates a second LO signal, based on cross-coupled latches. The device generates a second LO signal for operating an I mixer and a Q mixer, based on the first LO signal. According to an embodiment, the device corrects the phase of an LO signal, based on an active balun, and generates an I/Q signal, based on cross-coupled latches. A gain mismatch and a phase mismatch between an in-phase mixer (I-mixer) and a quadrature mixture (Q-mixer) can be reduced based on CML latches that are cross-coupled to each other. According to an embodiment, in order to generate a second LO signal that is a rail-to-rail signal related to the first LO signal, a signal generator generates a rail-to-rail type second LO signal by using an LO buffer based on a limiter implemented by cascade-connecting of an inverter-based high gain amplifier.

In operation 1405, the device receives an input signal. An input signal received by the device may include at least one of a baseband signal and an intermediate frequency signal.

In operation 1407, the device generates an upconverted frequency signal, based on the second LO signal and the input signal. The device uses the second LO signal and the input signal to generate a frequency-upconverted signal, based on a frequency mixer. According to an embodiment, if the device receives a baseband signal, the device may change the baseband signal into an intermediate frequency signal and amplify the intermediate frequency signal. If the device receives an intermediate frequency signal, the device may amplify the received intermediate frequency signal to use same. The device performs frequency upconversion through the frequency mixer, based on an amplified intermediate frequency signal and the second LO signal generated in operation 1403.

In operation 1409, the device generates an output signal obtained by processing a harmonic component included in the generated upconverted frequency, based on a negative transconductance (GM) operating in a sub-threshold region. According to an embodiment, the device generates a signal converted in a current mode, by a method of inputting a frequency signal upconverted through the mixer, in a GM stage implemented as a cascode circuit. The device combines an I signal and a Q signal in a current mode, and inputs a combination signal to a negative GM stage implemented by a pair of cross-coupled NMOSs. A signal having passed through the GM stage may be divided into signals related to phases 0°, 90°, 180°, and 270°. A first signal including signals related to phases 0° and 270° and a second signal including signals related to phases 90° and 180° are input to input nodes of the negative GM stage, respectively. The negative GM stage may operate in weak inversion in a sub-threshold region. The negative GM stage may generate a signal having the same frequency as that of a third harmonic component generated in the GM stage in order to remove the third harmonic component. The negative GM stage processes a harmonic component through a process of using a generated signal to offset a signal corresponding to a third harmonic component in a signal received from the GM stage. According to an embodiment, a process of generating an output signal obtained by processing a harmonic component includes a process in which the negative GM stage operates in weak inversion in a sub-threshold region, to offset a third harmonic component generated in the GM stage, based on a signal having the same frequency as that of the third harmonic component generated by the GM stage. According to an embodiment, a capacitor may be connected in parallel to both terminals of a primary coil of a transformer connected to a load of a GM stage, and a center frequency may be adjusted based on a capacitor bank configured by capacitors connected in parallel.

In operation 1411, the device transmits the generated output signal. The device transmits an RF output signal which has been upconverted in operation 1407, and does not include a harmonic component through post-processing based on the NGM.

Figure 15:
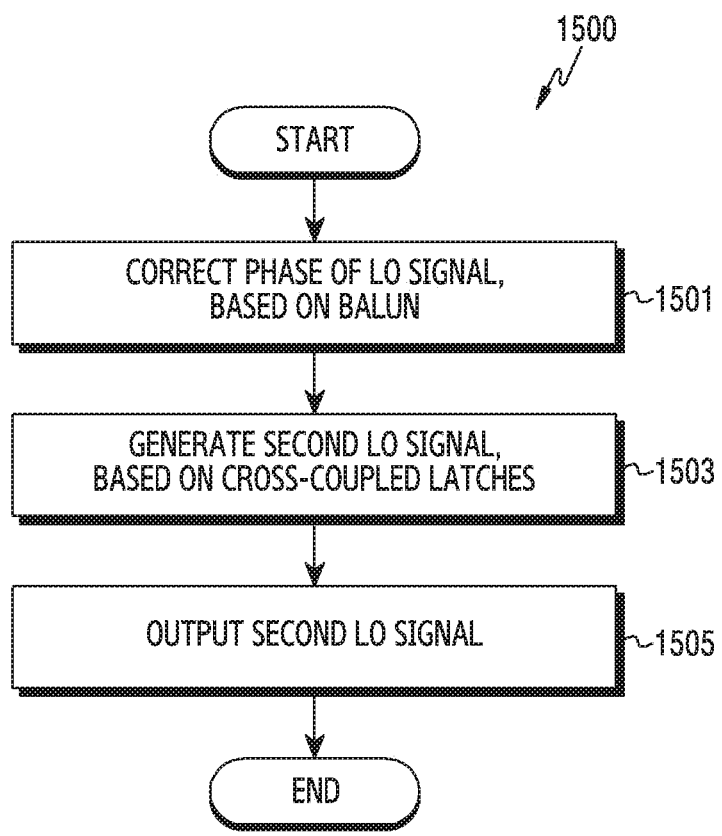
FIG. 15 is a flowchart of an operation of a signal generator of a device for upconverting frequency in a wireless communication system according to an embodiment of the disclosure.

FIG. 15 is a flowchart of an operation of a signal generator of a device for upconverting frequency in a wireless communication system according to an embodiment of the disclosure. FIG. 15 illustrates an operation process of the QSG 310 in FIG. 3.

Referring to FIG. 15, in operation 1501 of flowchart 1500, a signal generator corrects the phase of an LO signal, based on a balun. According to an embodiment, a QSG receives a first LO input signal through an active balun, and the balun outputs balanced signals, based on the first LO signal, and then transfers the signals to an LO driver. An inductor (inductive) peaking technique may be applied to the transferred signals.

In operation 1503, the signal generator generates a second LO signal, based on cross-coupled latches. According to an embodiment, the signal generator includes a plurality of latches operating in an ultra-high frequency band, and the plurality of latches may be cross-coupled to each other. The signal generator generates an I/Q output signal, based on cross-coupled CML latches. A gain mismatch and a phase mismatch between an in-phase mixer (I-mixer) and a quadrature mixture (Q– mixer) can be reduced based on CML latches that are cross-coupled to each other.

According to an embodiment, the cross-coupling manner includes a manner in which D+ and D– nodes of a first CML latch are connected to Q– and Q+ nodes of a second CML latch, and are connected to input nodes of a second LO buffer, respectively. Q+ and Q– nodes of the first CML latch are connected to D+ and D– nodes of the second CML latch, and are connected to input nodes of a first LO buffer, respectively. According to an embodiment, the device may generate a second LO signal that is a rail-to-rail signal having a duty ratio of 25%, based on the first LO signal.

In operation 1505, the signal generator outputs the second LO signal. According to an embodiment, in order to generate a second LO signal that is a rail-to-rail signal related to the first LO signal, the signal generator generates a rail-to-rail type second LO signal by using an LO buffer based on a limiter implemented by cascade-connecting of an inverter-based high gain amplifier. The signal generator may output the second LO signal and transfer the signal to a signal converter for frequency upconversion.

Figure 16:
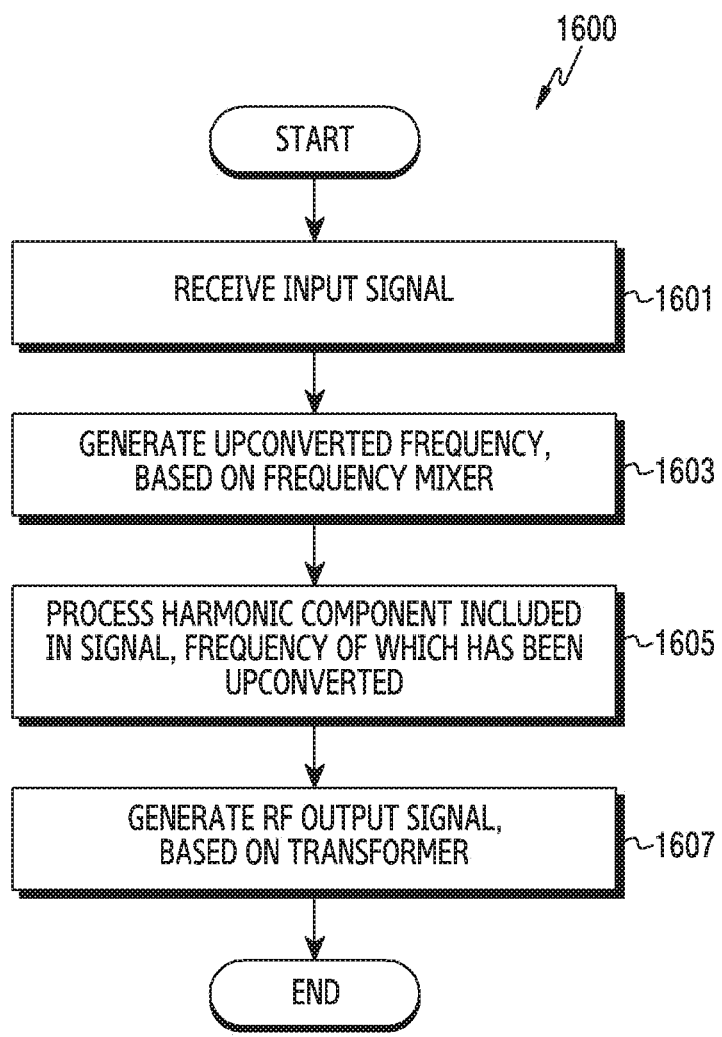
FIG. 16 is a flowchart of an operation of a signal converter of a device for upconverting frequency in a wireless communication system according to an embodiment of the disclosure.

FIG. 16 is a flowchart of an operation of a signal converter of a device for upconverting frequency in a wireless communication system according to an embodiment of the disclosure. FIG. 16 illustrates an operation process of the Tx up-mixer chain 360 in FIG. 3.

Referring to FIG. 16, in operation 1601 of flowchart 1600, the signal converter receives an input signal. According to an embodiment, if the signal converter receives a baseband signal, the signal converter may change the baseband signal into an intermediate frequency signal and amplify the intermediate frequency signal. If the signal converter receives an intermediate frequency signal, the signal converter may amplify the received intermediate frequency signal.

In operation 1603, the signal converter generates an upconverted frequency, based on a frequency mixer. According to an embodiment, the signal converter may upconvert a frequency through a passive double-balanced frequency mixer, based on an amplified intermediate frequency signal and a second LO signal. According to an embodiment, the signal converter may operate an IF node of a passive double-balanced frequency mixer having low impedance. The frequency mixer may be operated based on an LO signal transferred from the signal generator and an input signal transferred from an IF amplifier. The signal converter operates the frequency mixer to perform frequency upconversion. A voltage signal, the frequency of which has been upconverted in an RF port of the frequency mixer is converted into an RF current, based on a mixer GM stage, and converted RF current signals are combined at a primary coil node of a transformer in a current mode.

In operation 1605, the signal converter processes a harmonic component included in a signal, the frequency of which has been upconverted. According to an embodiment, the signal converter may remove a harmonic component from the upconverted frequency, based on a negative GM stage. The signal converter may include the negative GM stage including two NMOSs arranged in a cross-coupled pair structure, the negative GM stage disposed at both terminals of a primary coil having a differential (balanced) structure in the transformer.

The signal converter may configure the negative GM stage to operate in a sub-threshold region so as to generate a component having the same size as that of a third harmonic component generating in the GM stage and having a different polarity to the same component. The Tx up-mixer chain 360 may remove a third harmonic component by using a component having the same size as that of the third harmonic component and having a different polarity to the same component.

According to an embodiment, the signal converter may combine an I signal and a Q signal in a current mode, and configure a negative resistance such that the negative resistance implemented by a pair of cross-coupled NMOSs is connected in parallel to both terminals of a resistor, and operates in a sub-threshold region. Therefore, the signal converter can remove a third harmonic component occurring a GM stage. The signal generator may generate a component having the same size as that of the third harmonic component occurring in the GM stage and having a different polarity to the same component. The signal generator may remove a third harmonic component by using a component having the same size as that of the third harmonic component and having a different polarity to the same component. According to an embodiment, a capacitor may be connected in parallel to both terminals of a primary coil of a transformer connected to a load of a GM stage, and a center frequency may be adjusted based on a capacitor bank configured by capacitors connected in parallel.

In operation 1607, the signal converter generates an RF output signal, based on a transformer. The signal converter combines signals converted into RF currents, based on the GM stage, in a current mode at a primary coil node of the transformer, to create a complex signal (I+jQ). The signal converter allows the created complex signal to be magnetic-coupled to a single-ended secondary coil, so as to create an RF output signal.

Figure 17:
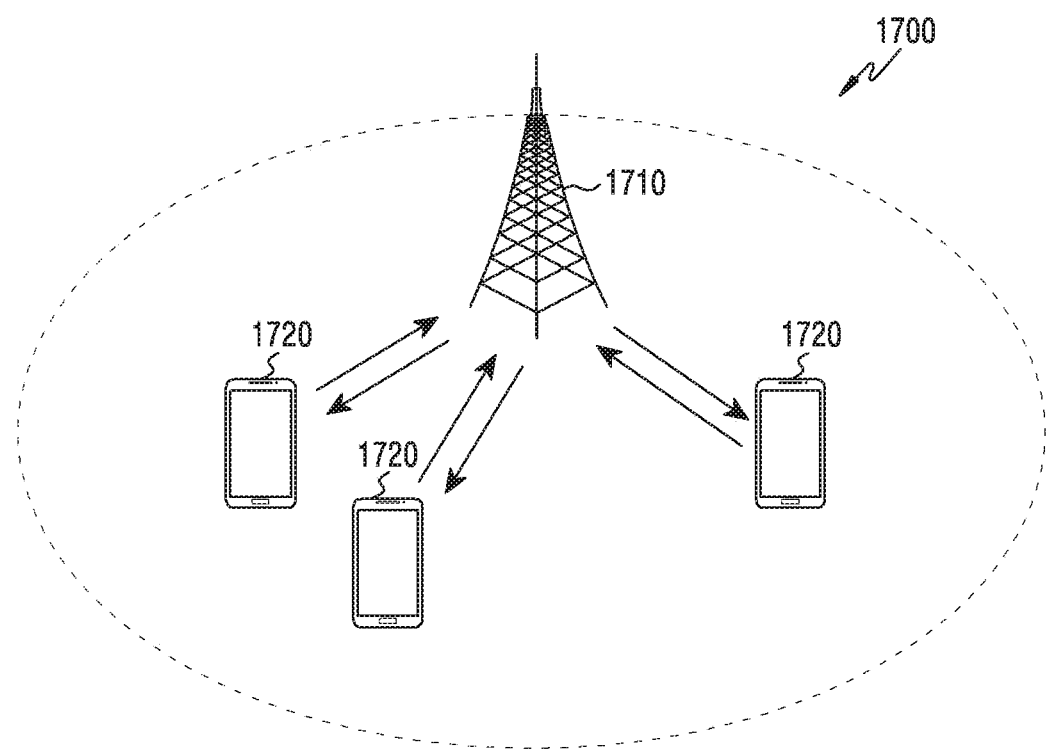
FIG. 17 illustrates a wireless communication system according to an embodiment of the disclosure.

FIG. 17 illustrates a wireless communication system according to an embodiment of the disclosure.

Referring to FIG. 17, in a wireless communication environment 1700, as a part of nodes using a wireless channel, a base station 1710 and a terminal 1720 are illustrated as an example.

The base station 1710 is a network infrastructure that provides wireless connection to the terminal 1720. The base station 1710 has a coverage defined as a particular geographic area based on a distance by which the base station can transmit a signal. The base station 1710 may be called "an access point (AP)", "an eNodeB (eNB)", "a 5th generation (5G) node", "a 5G NodeB (NB)", "a wireless point", "a transmission/reception point (TRP)", "an access unit", "a distributed unit (DU)", "a transmission/reception point (TRP)", "a radio unit (RU)", a remote radio head (RRH)", or other terms having a technical meaning equivalent thereto. The base station 1710 may transmit a downlink signal or receive an uplink signal.

The terminal 1720 is a device used by a user and communicates with the base station 1710 through wireless channels. In some cases, the terminal 1720 may be operated without involvement of a user. That is, the terminal 1720 is a device configured to perform machine-type communication (MTC) and may not be carried by a user. The terminal 1720 may be called "a user equipment (UE)", "a mobile station", "a subscriber station", "a customer premises equipment (CPE)", "a remote terminal", "a wireless terminal", "an electronic device", "a vehicle terminal", "a user device", or another term having a technical meaning equivalent thereto.

Beamforming technology has been used as one of technologies for reducing the path loss of radio waves and increasing the transfer distance of radio waves. Generally, beamforming focuses a radio wave arrival region by using a plurality of antennas, or increases the directivity of receiving sensitivity in a particular direction. Therefore, the base station 1710 may include a plurality of antennas in order to form a beamforming coverage instead of forming a signal in an isotropic pattern by using a single antenna. According to an embodiment, the base station 1710 may include a massive MIMO unit (MMU). A set of multiple antennas may be called an antenna array, and each antenna included in an array may be called an array element or an antenna element. The antenna array may be configured in various types such as a linear array, and a planar array. The antenna array may be called a massive antenna array.

A main technology for increasing data capacity of 5G communications is a beamforming technology using an antenna array connected to multiple RF paths. To accomplish higher data capacity, it is required that the number of RF paths is increased, or power per RF path is increased. Increasing of the number of RF paths results in bigger size of a product. Now, the number of RF paths has reached the limit due to spatial constraints in installing actual base station equipment. In order to maintain the number of RF paths, and increase an antenna gain through high output, a splitter (or divider) is used to connect a plurality of antenna elements to an RF path, so as to increase an antenna gain. Antenna elements corresponding to an RF path may be called a sub-array.

In order to improve a communication performance, the number of antennas (or antenna elements) of equipment (e.g. the base station 1710) performing wireless communications has been increased. In addition, the number of RF parts (e.g. an amplifier, and a filter) and components for processing an RF signal received or transmitted through an antenna element is also increased. Therefore, when communication equipment is configured, a spatial gain and cost efficiency are essentially required with satisfaction of a communication performance.

FIG. 17 illustrates the base station 1710 as an example to explain an electronic device including a transceiver of the disclosure. However, various embodiments are not limited thereto. As an electronic device including a transceiver according to various embodiments, radio equipment performing a function equivalent to that of the base station 1710, radio equipment (e.g. TRP) connected to the base station, the terminal 1720 of FIG. 17, or other communication equipment used for 5G communications are all possible besides the base station.

According to the disclosure, the device for frequency upconversion may minimize a phase mismatch and a gain mismatch occurring by a mixer, to increase an image rejection ratio (IRR) of an image signal occurring by two mismatches, so as to improve an error vector magnitude (EVM) of a transmitter.

According to the disclosure, when a load of a drive amplifier of a TX up-mixer chain is implemented, the device for frequency upconversion may configure a negative resistance such that the negative resistance implemented by a pair of cross-coupled NMOSs is connected in parallel to both terminals of the load at both terminals of a primary coil having a differential (balanced) structure connected to a load of a GM stage, and operates in a sub-threshold region. The device for frequency upconversion may generate a component having the same size as that of a third harmonic component and having a different polarity to the harmonic component, the third harmonic component occurring in a cascode circuit applied to implement a GM-stage of an amplifier, so that OIP3 can be improved based on a method for removing the component in a load.

According to the disclosure, the device for frequency upconversion may generate an I/Q signal having a duty cycle of 25% through cross-coupled CML latches, and output a rail-to-rail voltage of the I/Q signal through a limiter completed by cascade-connecting three inverter-based high gain amplifiers, in order to mix frequency through switching of LO nodes of an I mixer and a Q mixer which are passive double-balanced frequency mixers configuring a Tx up-mixer chain. The device for frequency upconversion may minimize a phase mismatch and a gain mismatch occurring by a frequency mixer of a Tx up-mixer chain, to obtain high IRR and reduce a chip area.

According to an embodiment as described above, an operation method of a device for upconversion in a wireless communication system may include: receiving a first local oscillator (LO) signal; generating a second LO signal, based on the first LO signal and cross-coupled latches; receiving an input signal; generating an upconverted frequency, based on the second LO signal and the input signal; generating an output signal obtained by processing a harmonic component included in the upconverted frequency; and transmitting the generated output signal.

In an embodiment, the generating of the second LO signal, based on the first LO signal and the cross-coupled latches may include: based on an active balun, generating a signal obtained by correcting a phase of the first LO signal; generating an in-phase/quadrature (I/Q) signal, based on the cross-coupled latches; and generating the second LO signal, based on an LO buffer based on a limiter in which an inverter-based high gain amplifier is cascade-connected.

In an embodiment, an inductive peaking technique may be applied to the phase-corrected signal, and the second LO signal may include a signal amplified to have a rail-to-rail size with respect to the first LO signal.

In an embodiment, the operation method may further include: if the input signal is a baseband signal, changing the baseband signal into an intermediate frequency signal and amplifying the intermediate frequency signal; and if the input signal is an intermediate frequency signal, amplifying the intermediate frequency signal.

In an embodiment, the upconverted frequency may be generated by passing the second LO signal and the input signal through a passive double-balanced frequency mixer.

In an embodiment, the generating of the upconverted frequency may include converting the signals having passed through the double-balanced frequency mixer, into a radio frequency (RF) current signal.

In an embodiment, a transistor included in the device may be configured by only an n-channel metal oxide semiconductor (NMOS) transistor.

In an embodiment, the generating of the output signal obtained by processing the harmonic component may include: operating a negative transconductance (GM) stage in a sub-threshold region to remove a third harmonic component occurring in a GM stage, wherein the negative GM is implemented by a pair of cross-coupled NMOSs.

In an embodiment, a center frequency may be adjusted based on a capacitor bank configured by capacitors connected to the negative GM stage in parallel.

In an embodiment, the generating of the output signal may include: combining signals converted into RF currents, at a primary coil node of a transformer in a current mode to generate a complex signal; and magnetically coupling the generated complex signal to a single-ended secondary coil to generate an RF output signal.

According to an embodiment as described above, a device for upconversion in a wireless communication system may include: at least one transceiver; and at least one processor functionally coupled to the at least one transceiver, wherein the at least one processor is configured to perform control to: receive a first local oscillator (LO) signal; generate a second LO signal, based on the first LO signal and cross-coupled latches; receive an input signal; generate an upconverted frequency, based on the second LO signal and the input signal; generate an output signal obtained by processing a harmonic component included in the upconverted frequency; and transmit the generated output signal.

In an embodiment, the at least one processor may be configured to: based on an active balun, generate a signal obtained by correcting a phase of the first LO signal; generate an in-phase/quadrature (I/Q) signal, based on the cross-coupled latches; and generate the second LO signal, based on an LO buffer based on a limiter in which an inverter-based high gain amplifier is cascade-connected.

In an embodiment, an inductive peaking technique may be applied to the phase-corrected signal, and the second LO signal may include a signal amplified to have a rail-to-rail size with respect to the first LO signal.

In an embodiment, the at least one processor may be configured to: if the input signal is a baseband signal, change the baseband signal into an intermediate frequency signal and amplify the intermediate frequency signal; and if the input signal is an intermediate frequency signal, amplify the intermediate frequency signal.

In an embodiment, the upconverted frequency may be generated by passing the second LO signal and the input signal through a passive double-balanced frequency mixer.

In an embodiment, the at least one processor may be configured to: convert the signals having passed through the double-balanced frequency mixer, into a radio frequency (RF) current signal.

In an embodiment, a transistor included in the device may be configured by only an n-channel metal oxide semiconductor (NMOS) transistor.

In an embodiment, the at least one processor may be configured to: operate a negative transconductance (GM) stage in a sub-threshold region to remove a third harmonic component occurring in a GM stage, wherein the negative GM is implemented by a pair of cross-coupled NMOSs.

In an embodiment, a center frequency may be adjusted based on a capacitor bank configured by capacitors connected to the negative GM stage in parallel.

In an embodiment, the at least one processor may be configured to: combine signals converted into RF currents, at a primary coil node of a transformer in a current mode to generate a complex signal; and magnetically couple the generated complex signal to a single-ended secondary coil to generate an RF output signal.

Methods disclosed in the claims and/or methods according to various embodiments described in the specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of them may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device via an external port. Further, a separate storage device on the communication network may access a portable electronic device.

In the above-described detailed embodiments of the disclosure, an element included in the disclosure is expressed in the singular or the plural according to presented detailed embodiments. However, the singular form or plural form is selected appropriately to the presented situation for the convenience of description, and the disclosure is not limited by elements expressed in the singular or the plural. Therefore, either an element expressed in the plural may also include a single element or an element expressed in the singular may also include multiple elements.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A method performed by a device for up-conversion in a wireless communication system, the method comprising:
receiving a first local oscillator (LO) signal;
generating a second LO signal, based on the first LO signal and cross-coupled latches;
receiving an input signal;
generating an upconverted frequency signal, based on the second LO signal and the input signal;
generating a upconverted radio frequency (RF) signal based on the generated upconverted frequency signal and a transconductance (GM) stage;
generating a removal component, based on a size and a polarity of a harmonic component of the upconverted RF signal, and a negative transconductance (NGM) stage operating in a sub-threshold region, wherein the NGM stage is implemented by a pair of cross-coupled n-channel metal oxide semiconductor (NMOS) transistors;
generating an output signal based on the upconverted RF signal and the removal component; and
transmitting the generated output signal.

2. The method of claim 1, wherein the generating of the second LO signal, based on the first LO signal and the cross-coupled latches comprises:
based on an active balun, generating a signal obtained by correcting a phase of the first LO signal;
generating an in-phase/quadrature (I/Q) signal, based on the cross-coupled latches; and
generating the second LO signal, based on an LO buffer based on a limiter in which an inverter-based high gain amplifier is cascade-connected.

3. The method of claim 2,
wherein an inductive peaking technique is applied to the phase-corrected first LO signal, and
wherein the second LO signal comprises a signal amplified to have a rail-to-rail size with respect to the first LO signal.

4. The method of claim 1, further comprising:
when the input signal is a baseband signal, changing the baseband signal into an intermediate frequency signal and amplifying the intermediate frequency signal; and
when the input signal is the intermediate frequency signal, amplifying the intermediate frequency signal.

5. The method of claim 1, wherein the upconverted frequency signal is generated by passing the second LO signal and the input signal through a passive double-balanced frequency mixer.

6. The method of claim 5, wherein the generating of the upconverted frequency signal comprises converting the second LO signal and the input signal having passed through the passive double-balanced frequency mixer, into an RF current signal.

7. The method of claim 1, wherein a transistor included in the device is configured by only an NMOS transistor.

8. The method of claim 1,
wherein the generating of the output signal obtained by processing the harmonic component comprises operating the NGM stage in weak inversion to remove a third harmonic component occurring in the GM stage.

9. The method of claim 8, wherein a center frequency is adjusted based on a capacitor bank configured by capacitors connected to the NGM stage in parallel.

10. The method of claim 1, wherein the generating of the output signal comprises:
combining signals converted into RF currents, at a primary coil node of a transformer in a current mode to generate a complex signal; and
magnetically coupling the generated complex signal to a single-ended secondary coil to generate an RF output signal.

11. A device for up-conversion in a wireless communication system, the device comprising:
at least one transceiver; and
at least one processor functionally coupled to the at least one transceiver,
wherein the at least one processor is configured to:
receive a first local oscillator (LO) signal,
generate a second LO signal, based on the first LO signal and cross-coupled latches,
receive an input signal,
generate an upconverted frequency signal, based on the second LO signal and the input signal,
generate a upconverted radio frequency (RF) signal based on the generated upconverted frequency signal and a transconductance (GM) stage,
generate a removal component, based on a size and a polarity of a harmonic component of the upconverted RF signal, and a negative transconductance (NGM) stage operating in a sub-threshold region, wherein the NGM stage is implemented by a pair of cross-coupled n-channel metal oxide semiconductor (NMOS) transistors,
generate an output signal based on the upconverted RF signal and the removal component, and
transmit the generated output signal.

12. The device of claim 11, wherein the at least one processor is further configured to:
based on an active balun, generate a signal obtained by correcting a phase of the first LO signal,
generate an in-phase/quadrature (I/Q) signal, based on the cross-coupled latches, and
generate the second LO signal, based on an LO buffer based on a limiter in which an inverter-based high gain amplifier is cascade-connected.

13. The device of claim 12,
wherein an inductive peaking technique is applied to the phase-corrected first LO signal, and
wherein the second LO signal comprises a signal amplified to have a rail-to-rail size with respect to the first LO signal.

14. The device of claim 11, wherein the at least one processor is further configured to:
when the input signal is a baseband signal, change the baseband signal into an intermediate frequency signal and amplify the intermediate frequency signal, and
when the input signal is an intermediate frequency signal, amplify the intermediate frequency signal.

15. The device of claim 11, wherein the upconverted frequency signal is generated by passing the second LO signal and the input signal through a passive double-balanced frequency mixer.

16. The device of claim 15, wherein the at least one processor is further configured to convert the second LO signal and the input signal having passed through the passive double-balanced frequency mixer, into a an RF current signal.

17. The device of claim 11, wherein a transistor included in the device is configured by only an NMOS transistor.

18. The device of claim 11,
wherein the at least one processor is further configured to:
operate the NGM stage in weak inversion to remove a third harmonic component occurring in the GM stage.

19. The device of claim 18, wherein a center frequency is adjusted based on a capacitor bank configured by capacitors connected to the NGM stage in parallel.

20. The device of claim 11, wherein the at least one processor is further configured to:
combine signals converted into RF currents, at a primary coil node of a transformer in a current mode to generate a complex signal, and
magnetically couple the generated complex signal to a single-ended secondary coil to generate an RF output signal.

* * * * *